(12) United States Patent
Cho et al.

(10) Patent No.: US 9,343,009 B2
(45) Date of Patent: May 17, 2016

(54) ORGANIC LIGHT EMITTING DIODE DISPLAY DEVICE

(71) Applicant: Samsung Display Co., Ltd., Yongin, Gyeonggi-do (KR)

(72) Inventors: Se-Hyoung Cho, Yongin (KR); Kyung-Hoon Kim, Yongin (KR); Dong-Woo Kim, Yongin (KR); Il-Gon Kim, Yongin (KR); Kang-Moon Jo, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/577,994

(22) Filed: Dec. 19, 2014

(65) Prior Publication Data

US 2016/0027377 A1  Jan. 28, 2016

(30) Foreign Application Priority Data

Jul. 24, 2014  (KR) .......................... 10-2014-0093716

(51) Int. Cl.
*G09G 3/32* (2016.01)
*H05B 33/04* (2006.01)
*H01L 27/32* (2006.01)

(52) U.S. Cl.
CPC .......... *G09G 3/3208* (2013.01); *H01L 27/3244* (2013.01); *H05B 33/04* (2013.01); *G09G 2310/08* (2013.01); *G09G 2330/021* (2013.01)

(58) Field of Classification Search
USPC ................. 313/512, 505, 498–501, 506, 509; 315/169.1, 169, 2, 169.3, 169.4
See application file for complete search history.

(56) References Cited

U.S. PATENT DOCUMENTS

| 2003/0184701 | A1* | 10/2003 | Ohta ................. G02F 1/134363 349/141 |
| 2009/0016031 | A1 | 1/2009 | Matsumoto |
| 2013/0050292 | A1 | 2/2013 | Mizukoshi |

FOREIGN PATENT DOCUMENTS

| KR | 10-2004-0059037 | 7/2004 |
| KR | 10-2009-0006002 | 1/2009 |
| KR | 10-2009-0104192 | 10/2009 |

* cited by examiner

*Primary Examiner* — Tuyet Vo
(74) *Attorney, Agent, or Firm* — Knobbe Martens Olson & Bear LLP

(57) ABSTRACT

An organic light emitting diode display device includes a display panel and a power supply. The power supply applies a first power supply voltage and a second power supply voltage to a first power supply voltage line. The first power supply voltage line includes a first extension, a second extension, and third extension. The first extension is disposed along a first direction from the first side portion to the second side portion. The first extension has a width that gradually decreases along the first direction. The second extension is disposed along a second direction that is perpendicular to the first direction. The third extension is disposed along a third direction that is opposite to the first direction. The third extension has a width that gradually decreases along the third direction.

20 Claims, 13 Drawing Sheets

ORGANIC LIGHT EMITTING DIODE DISPLAY DEVICE

CROSS-REFERENCE TO RELATED APPLICATION(S)

This application claims priority to Korean Patent Application No. 10-2014-0093716, filed on Jul. 24, 2014 in the Korean Intellectual Property Office (KIPO), the contents of which are incorporated herein in their entirety by reference.

BACKGROUND

1. Field

Example embodiments relate generally to a display device. More particularly, embodiments relate to an organic light emitting diode display device.

2. Description of the Related Technology

A flat panel display (FPD) device is widely used as a display device of an electronic device because the flat panel display device is lightweight and thin compared to a cathode-ray tube (CRT) display device, for example. Typical examples of the flat panel display device are a liquid crystal display (LCD) device and an organic light emitting diode (OLED) display device. Compared to the LCD, the OLED has many advantages such as a higher luminance and a wider viewing angle. In addition, the OLED display device can be made thinner because the OLED display device does not require a backlight. In the OLED display device, electrons and holes are injected into an organic thin layer through a cathode and an anode, and then recombined in the organic thin layer to generate excitons, thereby a light of a certain wavelength can be emitted.

As the OLED display device becomes larger, an IR drop of a power supply voltage has become intensified in a display panel of the OLED display device. In order to reduce the IR-drop, a dual bank method display device where a power supply and a data driver are located in both sides of the display panel has been developed. However, even in case of the dual bank method display device, luminance may be gradually reduced from top portion and bottom portion of the display panel to center region of the display panel. Further, compared to a single bank method, the dual bank method OLED display device may include many components (including, for example, the data driver and the power supply). Thus, a manufacturing cost may be increased, and a dead space may be increased.

SUMMARY OF CERTAIN INVENTIVE ASPECTS

Some example embodiments provide an organic light emitting diode display device including a power supply voltage line having a separation region capable of reducing a voltage drop that is generated in the organic light emitting diode display device.

According to one aspect of example embodiments, an organic light emitting diode display device includes a display panel and a power supply. The display panel includes a plurality of pixels, the display panel having a first side portion, a second side portion opposite to the first side portion, and a center portion located between the first side portion and the second side portion. The power supply applies a first power supply voltage and a second power supply voltage to a first power supply voltage line. The power supply is located adjacent to the first side portion of the display panel. The first power supply voltage line includes a first extension, a second extension, and third extension. The first extension is disposed along a first direction from the first side portion to the second side portion. The first extension has a width that gradually decreases along the first direction. The second extension is disposed along a second direction that is perpendicular to the first direction. The third extension is disposed along a third direction that is opposite to the first direction. The third extension has a width that gradually decreases along the third direction.

In example embodiments, the first through third extensions of the first power supply voltage line may be disposed at the same level and formed as one body.

In example embodiments, the first extension of the first power supply voltage line may include a first portion located adjacent to the first side portion of the display panel and a second portion located adjacent to the second side portion of the display panel.

In example embodiments, the first power supply voltage may be applied to the first portion of the first extension.

In example embodiments, the first extension of the first power supply voltage line may be connected to the pixels.

In example embodiments, the third extension of the first power supply voltage line may include a third portion located adjacent to the first side portion of the display panel and a fourth portion located adjacent to the second side portion of the display panel.

In example embodiments, the second power supply voltage may be applied to the third portion of the third extension.

In example embodiments, the second extension of the first power supply voltage line may include a fifth portion connected to the second portion of the first extension and a sixth portion connected to the fourth portion of the third extension.

In example embodiments, the second extension may be located adjacent to the second side portion of the display device.

In example embodiments, the organic light emitting diode display device may further include a separation region interposed between the first extension and the third extension such that the first extension and the third extension are separated.

In example embodiments, the separation region may include a first end and a second end.

In example embodiments, the first end of the separation region may be located adjacent to the first side portion of the display panel.

In example embodiments, the first end of the separation region may be opened in the third direction.

In example embodiments, the second end of the separation region may be located adjacent to the second side portion of the display panel.

In example embodiments, the second end of the separation region may be closed in the first direction by the second extension.

In example embodiments, the separation region may have at least one of a line-shaped opening or a bar-shaped opening.

In example embodiments, the separation region may have a curve-shaped opening.

In example embodiments, the curve in the curve-shaped opening may be formed such that a slope from the first side portion to the center portion is less than a slope from the center portion to the second side portion.

In example embodiments, the first power supply voltage may be applied to the pixels via the first extension in the first direction from the first side portion to the second side portion.

In example embodiments, the second power supply voltage may be applied to the pixels via the first extension in the third direction from the second side portion to the first side portion after the second power supply voltage is transferred via the third extension and the second extension in the first direction from the first side portion to the second side portion.

In example embodiments, a voltage level of the first power supply voltage may be lower than a voltage level of the second power supply voltage.

In example embodiments, the organic light emitting diode display device may further include a second power supply voltage line.

In example embodiments, the second power supply voltage line may be extended along the first direction.

In example embodiments, the second power supply voltage line may be connected to the pixels.

In example embodiments, the second power supply voltage line may include a first end and a second end.

In example embodiments, a first end of the second power supply voltage line may be located adjacent to the first side region of the display panel.

In example embodiments, the first end of the second power supply voltage line may be connected to the power supply.

In example embodiments, a second end of the second power supply voltage line may be located adjacent to the second side portion.

In example embodiments, the power supply may apply a third power supply voltage to the first end of the second power supply voltage line.

According to another aspect of example embodiments, an organic light emitting diode display device includes a display panel and a power supply. The display panel includes a plurality of pixels, the display panel having a first side portion, a second side portion opposite to the first side portion, and a center portion located between the first side portion and the second side portion. The power supply applies a first power supply voltage to a first power supply voltage line. The power supply is located adjacent to the first side portion of the display panel. The first power supply voltage line includes a first extension, a second extension, and a third extension. The first extension is disposed along a first direction from the first side portion to the second side portion. The first extension has a width that gradually decreases along the first direction. The second extension is disposed along a second direction that is perpendicular to the first direction. The third extension is disposed along a third direction that is opposite to the first direction. The third extension has a width that gradually decreases along the third direction.

In example embodiments, the first through third extensions of the first power supply voltage line may be disposed at the same level and formed as one body.

In example embodiments, the first extension of the first power supply voltage line may include a first portion located adjacent to the first side portion of the display panel and a second portion located adjacent to the second side portion of the display panel.

In example embodiments, the first extension of the first power supply voltage line may be connected to the pixels.

In example embodiments, the third extension of the first power supply voltage line may include a third portion located adjacent to the first side portion of the display panel and a fourth portion located adjacent to the second side portion of the display panel.

In example embodiments, the first power supply voltage may be applied to the third portion of the third extension In example embodiments, the second extension of the first power supply voltage line may include a fifth portion connected to the second portion of the first extension and a sixth portion connected to the fourth portion of the third extension.

In example embodiments, the second extension may be located adjacent to the second side portion of the display device.

In example embodiments, the organic light emitting diode display device may further include a separation region.

In example embodiments, the separation region may be interposed between the first extension and the third extension such that the first extension and the third extension are separated from one another.

In example embodiments, the separation region includes a first end and a second end.

In example embodiments, the first end of the separation region may be located adjacent to the first side portion of the display panel.

In example embodiments, the first end of the separation region may be opened in the third direction.

In example embodiments, the second end of the separation region may be located adjacent to the second side portion of the display panel.

In example embodiments, the second end of the separation region may be closed in the first direction by the second extension.

In example embodiments, the separation region may have at least one of a line-shaped opening, a bar-shaped opening, or a curve-shaped opening.

In example embodiments, the first power supply voltage may be applied to the pixels via the first extension in the third direction from the second side portion to the first side portion after the first power supply voltage is transferred via the third extension and the second extension in the first direction from the first side portion to the second side portion.

In example embodiments, the organic light emitting diode display device may further include a transistor disposed between the power supply and the first power supply voltage line.

In example embodiments, the transistor may directly apply a compensation current to the pixels when a voltage drop occurs at the first power supply voltage line.

In example embodiments, the organic light emitting diode display device may further include a resistance disposed between the power supply and the first power supply voltage line.

In example embodiments, a compensation current may be applied to the first portion of the first extension via the resistance when a voltage drop occurs at the first power supply voltage line.

In example embodiments, the organic light emitting diode display device may further include a diode-coupled transistor disposed between the power supply and the first power supply voltage line.

In example embodiments, the diode-coupled transistor may apply a compensation current to the first portion of the first extension.

In example embodiments, the organic light emitting diode display device may further include a second power supply voltage line extended along the first direction.

In example embodiments, the second power supply voltage line may be connected to the pixels.

In example embodiments, the second power supply voltage line may include a first end and a second end.

In example embodiments, the first end of the second power supply voltage line may be located adjacent to the first side portion of the display panel.

In example embodiments, the first end of the second power supply voltage line may be connected to the power supply.

In example embodiments, the second end of the second power supply voltage line may be located adjacent to the second side portion.

In example embodiments, the power supply may apply a second power supply voltage to the first end of the second power supply voltage line.

As an organic light emitting diode display device according to example embodiments may include a power supply voltage line having a separation region, a voltage drop that is generated in the organic light emitting diode display device may be reduced.

BRIEF DESCRIPTION OF THE DRAWINGS

Example embodiments can be understood in more detail from the following description taken in conjunction with the accompanying drawings, in which.

DETAILED DESCRIPTION OF CERTAIN INVENTIVE EMBODIMENTS

Hereinafter, embodiments will be explained in detail with reference to the accompanying drawings.

Figure 1:
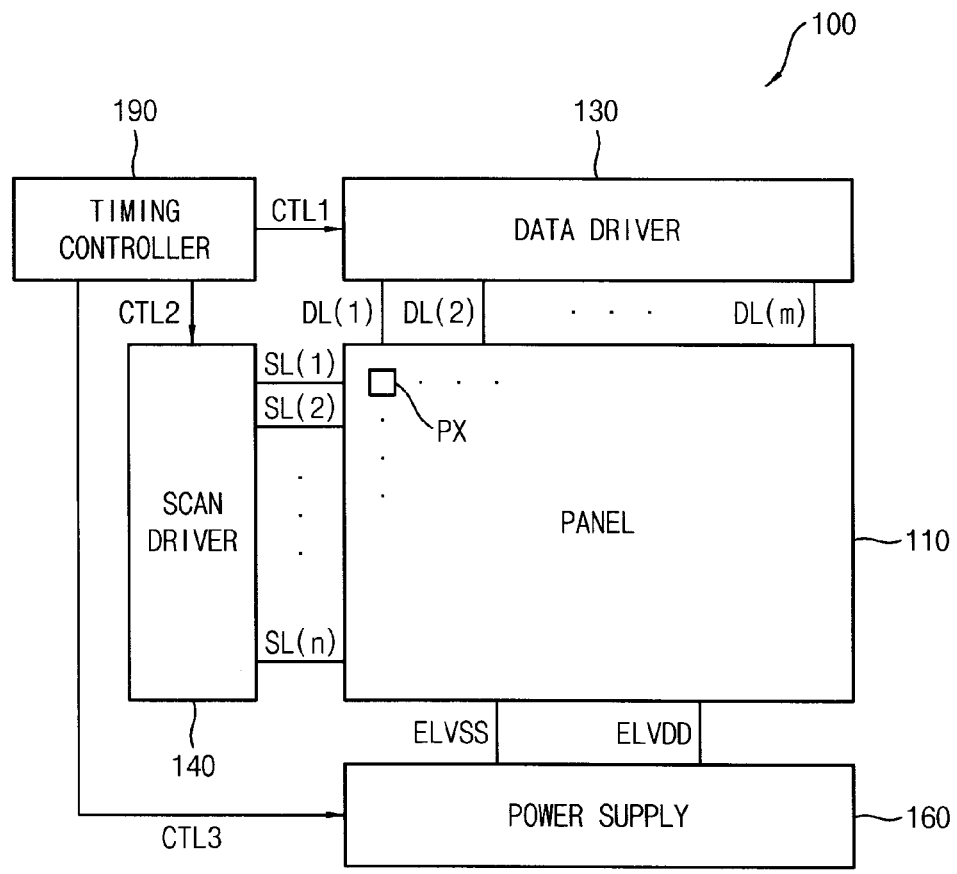
FIG. 1 is a block diagram illustrating an organic light emitting diode display device in accordance with example embodiments.

FIG. 1 is a block diagram illustrating an organic light emitting diode display device in accordance with example embodiments.

Referring to FIG. 1, an organic light emitting diode (OLED) display device 100 may include a display panel 110, a data driver 130, a scan driver 140, a power supply 160, and a timing controller 190.

The display panel 110 may be coupled to the scan driver 140 via scan-lines SL(1) through SL(n), and may be coupled to the data driver 130 via data-lines DL(1) through DL(m). In addition, the display panel 110 may be coupled to the power supply 160 via first and second power supply voltage lines. Further, the display panel 110 may include n*m pixels PX because the pixels PX are arranged at locations corresponding to crossing points of the scan-lines SL(1) through SL(n) and the data-lines DL(1) through DL(m).

The data driver 130 may provide a data signal to each of the pixels PX via the data-lines DL(1) through DL(m). For example, the data driver 130 may output a data signal to display panel 110 in response to a first timing control signal CTL1 of the timing controller 190.

The scan driver 140 may provide a scan signal to each of the pixels PX via the scan-lines SL(1) through SL(n). For example, the scan driver 140 may sequentially output a scan signal to the display panel 110 in response to a second timing control signal CTL2 of the timing controller 190. In some example embodiments, the OLED display device 100 may further include an additional scan driver 140. AcAs the OLED display device 100 becomes larger, two scan drivers 140 may be located in both side portions of the display panel 110 (therefore, the display panel would be located between scan drivers).

The timing controller 190 may generate first through third timing control signals CTL1, CTL2, and CTL3. As the timing controller 190 provides the first through third timing control signals CTL1, CTL2, and CTL3 to the data driver 130, the scan driver 140, and the power supply 160, the timing controller 190 may control the data driver 130, the scan driver 140, and the power supply 160. For example, as the timing controller 190 provides the second timing control signal CTL2 to the scan driver 140, the timing controller 190 may control the scan driver 140 such that the scan driver 140 sequentially outputs the scan signals to the display panel 110. In addition, as the timing controller 190 provides the first timing control signal CTL1 to the data driver 130, the timing controller 190 may control the data driver 130 such that the data driver 130 outputs each of the data signals corresponding to the pixel PX of the display panel 110. Further, as the timing controller 190 provides the third timing control signal CTL3 to the power supply 160, the timing controller 190 may control the power supply 160 such that the power supply 160 outputs a high power supply voltage ELVDD and a low power supply voltage ELVSS to the pixel PX of the display panel 110.

The power supply 160 may include the first and second power supply voltage lines. The power supply 160 may provide the high power supply voltage ELVDD and the low power supply voltage ELVSS to each of the pixels PX via the first and second power supply voltage lines. The OLED display device 100 including the first and second power supply voltage lines may reduce a voltage drop (such as for example, an IR drop) generated in the display panel 110. In example embodiments, the OLED display device 100 may further include an emission driver. The emission driver may sequentially or simultaneously provide the emission control signals to display panel 110 via one or more emission control lines.

Figure 2:
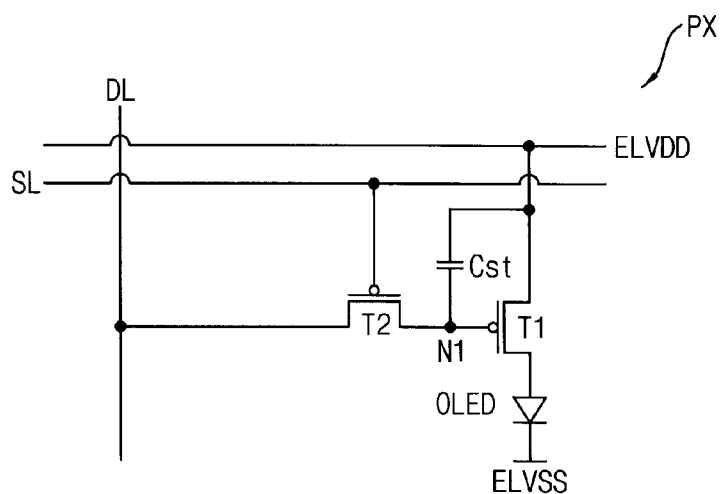
FIG. 2 is a circuit diagram illustrating an example of a pixel included in an organic light emitting diode display device of FIG. 1.

FIG. 2 is a circuit diagram illustrating an example of a pixel included in an organic light emitting diode display device of FIG. 1.

Referring to FIGS. 1 and 2, a pixel PX may include a driving transistor T1, a switching transistor T2, a storage capacitor Cst, and an organic light emitting diode OLED.

The switching transistor T2 includes a control electrode connected to the scan line SL to which the scan signal is applied, an input electrode connected to the data line DL to which the data voltage is applied, and an output electrode connected to a first node N1.

The switching transistor T2 is turned on and turned off in response to the scan signal. When the switching transistor T2 is turned on, the data voltage is applied to the first node N1.

The control electrode of the switching transistor T2 may be a gate electrode. The input electrode of the switching transistor T2 may be a source electrode. The output electrode of the switching transistor T2 may be a drain electrode.

In example embodiments, the switching transistor T2 may be a P-type transistor. The switching transistor T2 may be turned on when the scan signal has a low level.

The driving transistor T1 includes a control electrode connected to the first node N1, an input electrode to which the high power supply voltage ELVDD is applied, and an output electrode connected to an anode electrode of the organic light emitting diode OLED.

Since the pixel PX is driven by a digital driving method, the driving transistor T1 is operated in a linear region. Thus, the driving transistor T1 is turned on and turned off in response to a voltage at the first node N1. When the driving transistor T1 is turned on, the high power supply voltage ELVDD is applied to the anode electrode of the organic light emitting diode OLED.

The control electrode of the driving transistor T1 may be a gate electrode. The input electrode of the driving transistor T1 may be a source electrode. The output electrode of the driving transistor T1 may be a drain electrode.

In example embodiments, the driving transistor T1 may be a P-type transistor. The driving transistor T1 may be turned on when the voltage at the first node N1 is less than a turn on voltage of the first driving transistor T1.

The data signal may be applied to the storage capacitor Cst during a turn-on period of the scan signal SCAN. The storage capacitor Cst may store the applied data signal. The applied data signal may be maintained during a turn-off period of the scan signal.

The organic light emitting diode OLED includes the anode electrode connected to the output electrode of the driving transistor T1 and a cathode electrode to which a low power supply voltage ELVSS is applied.

When a difference between a voltage at the anode electrode and a voltage at the cathode electrode is equal to or greater than a threshold voltage, the organic light emitting diode OLED is turned on. When the difference between the voltage at the anode electrode and the voltage at the cathode electrode is less than the threshold voltage, the organic light emitting diode OLED is turned off.

The pixel PX of FIG. 1 may include various pixels other than the pixel of FIG. 2.

Figure 3:
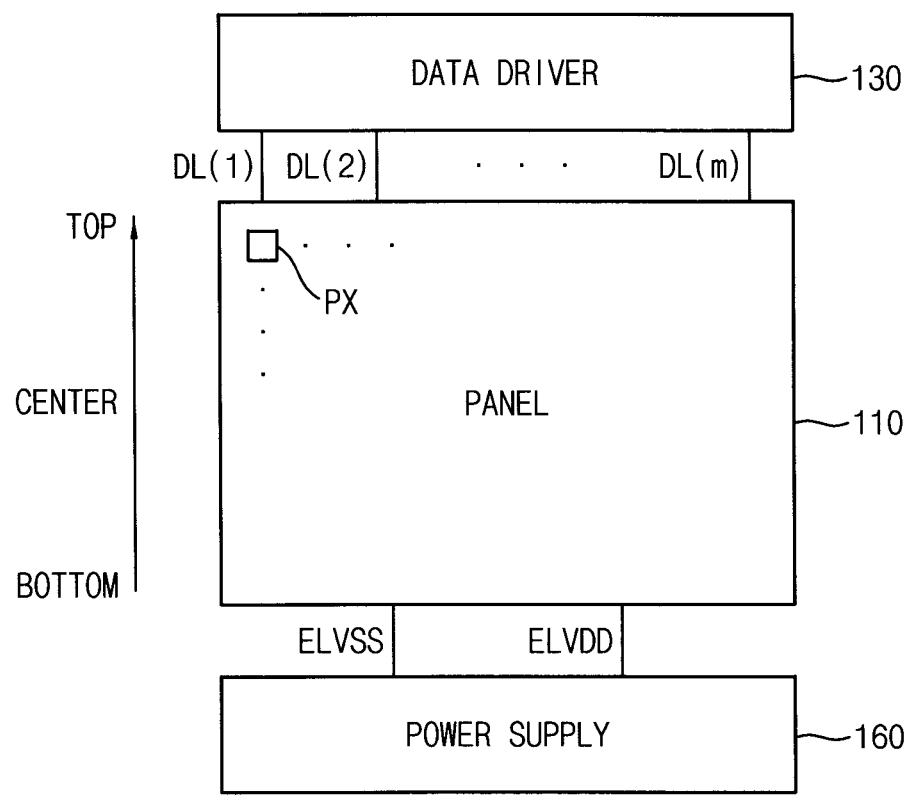
FIG. 3 is a block diagram for describing a display panel illustrated in FIG. 1.

FIG. 3 is a block diagram for describing a display panel illustrated in FIG. 1.

Referring to FIGS. 1 and 3, a display panel 110 may include a first side region BOTTOM, a center region CENTER, and a second side region TOP. For example, the first side region BOTTOM may be located opposite to the second side region TOP. The center region CENTER may be located between the first side region BOTTOM and the second side region TOP. The second side region TOP of the display panel 110 may be located adjacent to a data driver 130. The first side region BOTTOM of the display panel 110 may be located adjacent to a power supply 160. In example embodiments, a high power supply voltage ELVDD of the power supply 160 and a low power supply voltage ELVSS of the power supply 160 may be provided to the pixels PX from the first side region BOTTOM to the second side region TOP through the center region CENTER via the first and second power supply voltage lines.

Figure 4:
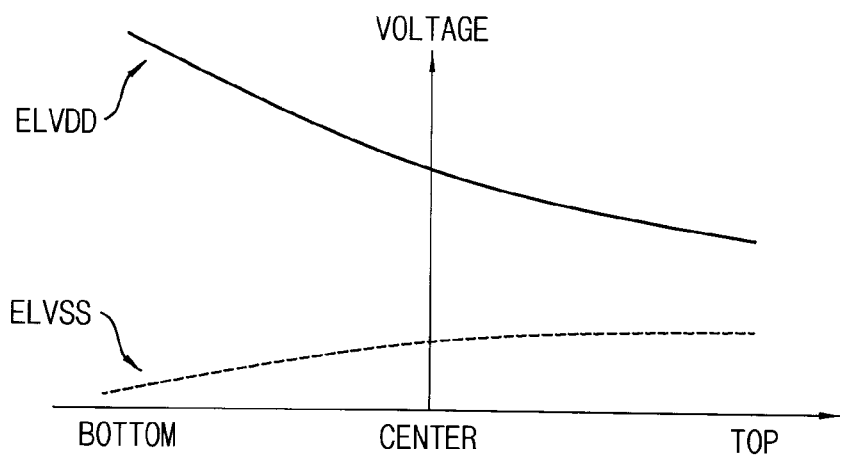
FIG. 4 is a graph illustrating an example of a high power supply voltage and a low power supply voltage when the display panel is driven by a single bank method.

FIG. 4 is a graph illustrating an example of a high power supply voltage and a low power supply voltage when the display panel is driven by a single bank method. A vertical axis of FIG. 4 is a magnitude of a voltage level, and a horizontal axis is a first side region BOTTOM, a center region CENTER, and a second side region TOP of a display panel 110 illustrated in FIG. 3.

Referring to FIGS. 3 and 4, when an OLED display device 100 is driven by a single bank method, a power supply 160 may be located adjacent to the first side region BOTTOM (or the second side region TOP) of a display panel 110. In this case, a high power supply voltage ELVDD may be applied to the first side region BOTTOM. A voltage level of the high power supply voltage ELVDD provided in the power supply 160 located adjacent to the first side region BOTTOM of the display panel 110 may be decreased by an IR drop because the high power supply voltage ELVDD is passed from the first side region BOTTOM to the second side region TOP through the center region CENTER. Meanwhile, a low power supply voltage ELVSS may be applied to the first side region BOTTOM of the display panel 110. A voltage level of the low power supply voltage ELVSS provided in the power supply 160 located adjacent to the first side region BOTTOM of the display panel 110 may be increased by the IR drop because the low power supply voltage ELVSS is passed from the first side region BOTTOM to the second side region TOP through the center region CENTER. When the OLED display device 100 is driven by a digital driving method, a difference of the high power supply voltage ELVDD and the low power supply voltage ELVSS may be defined as a luminance. As illustrated in FIG. 4, a long range uniformity (LRU) of the display panel 110 may be reduced, considering the difference of the high power supply voltage ELVDD and the low power supply voltage ELVSS. That is, a luminance of the first side region BOTTOM of the display panel 110 may be high, and the luminance may be gradually low toward a direction from the first side region BOTTOM to the second side region TOP. However, compared to a dual bank method, the single bank method may reduce a dead space. As the OLED display device 100 becomes larger, the phenomenon may occur with increased severity.

Figure 5:
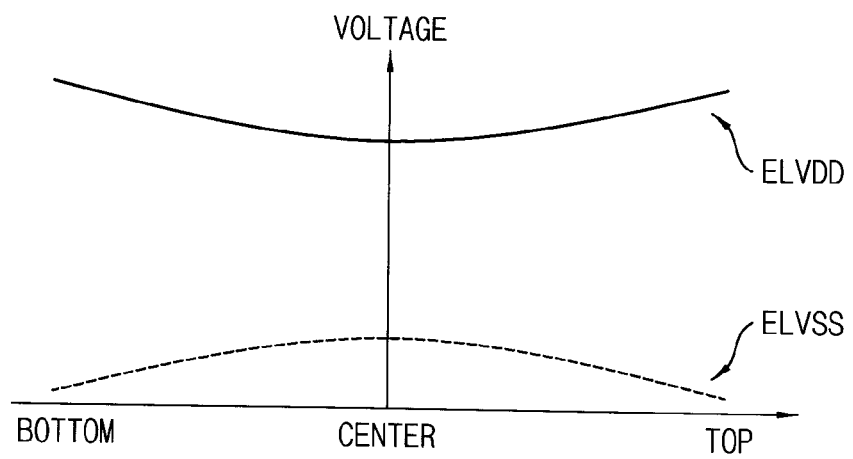
FIG. 5 is a graph illustrating an example of a high power supply voltage and a low power supply voltage when the display panel is driven by a dual bank method.

FIG. 5 is a graph illustrating an example of a high power supply voltage and a low power supply voltage when the display panel is driven by a dual bank method. A vertical axis of FIG. 5 is a magnitude of a voltage level, and a horizontal axis is a first side region BOTTOM, a center region CENTER, and a second side region TOP of a display panel 110 illustrated in FIG. 3.

Referring to FIGS. 3 and 5, when an OLED display device 100 is driven by a dual bank method, two power supply 160 may be located adjacent to the first side region BOTTOM of a display panel 110 and the second side region TOP of a display panel 110, respectively. In this case, a high power supply voltage ELVDD may be simultaneously applied to the first side region BOTTOM and the second side region TOP. A voltage level of the high power supply voltage ELVDD provided in the power supply 160 located adjacent to the second side region TOP of the display panel 110 may be decreased by an IR drop because the high power supply voltage ELVDD is passed from the second side region TOP to the center region CENTER. Similarly, a voltage level of the high power supply voltage ELVDD provided in the power supply 160 located adjacent to the first side region BOTTOM of the display panel 110 may be decreased by an IR drop because the high power supply voltage ELVDD is passed from the first side region BOTTOM to the center region CENTER. Meanwhile, a low power supply voltage ELVSS may be simultaneously applied to the first side region BOTTOM and the second side region TOP. A voltage level of the low power supply voltage ELVSS provided in the power supply 160 located adjacent to the second side region TOP of the display panel 110 may be increased by an IR drop because the low power supply voltage ELVSS is passed from the second side region TOP to the center region CENTER. Similarly, a voltage level of the low power supply voltage ELVSS provided in the power supply 160 located adjacent to the first side region BOTTOM of the display panel 110 may be increased by an IR drop because the low power supply voltage ELVSS is passed from the first side region BOTTOM to the center region CENTER. When the OLED display device 100 is driven by a digital driving method, a difference of the high power supply voltage ELVDD and the low power supply voltage ELVSS may be defined as a luminance. As illustrated in FIG. 5, a luminance of the first side region BOTTOM of the display panel 110 and the second side region TOP of the display panel 110 may be high, and a luminance of the center region CENTER of the display panel 110 may be low, considering the difference of the high power supply voltage ELVDD and the low power supply voltage ELVSS. Compared to a single bank method, an LRU of the display panel 110 may be relatively improved. However, an afterimage of an image sticking pattern (such as for example, a logo of a broadcaster, or the like) may be remained. In addition, a voltage level applied to the first side region BOTTOM of the display panel 110 and the second side region TOP of the display panel 110 may be higher than a voltage level applied to the center region CENTER of the display panel 110. Thus, compared to the center region CENTER, components located in the first side region BOTTOM and the second side region TOP may be quickly deteriorated. Further, when a user of the OLED display device 100 watches a movie by a wide screen method, the first and second side regions BOTTOM and TOP which are high luminance regions may display a black color. The center region CENTER which is a low luminance region may display an image. Thus, in this case, the OLED display device 100 may be inefficiently operated. Furthermore, the dual bank method OLED display device 100 may include many components such as additional power supply 160, additional data driver 130, and the like. A manufacturing cost of the OLED display device 100 may be increased. In addition, when the many components are added to the OLED display device 100, a dead space of the OLED display device 100 may be increased. As the OLED display device 100 becomes larger, the phenomenon may occur more seriously.

Figure 6:
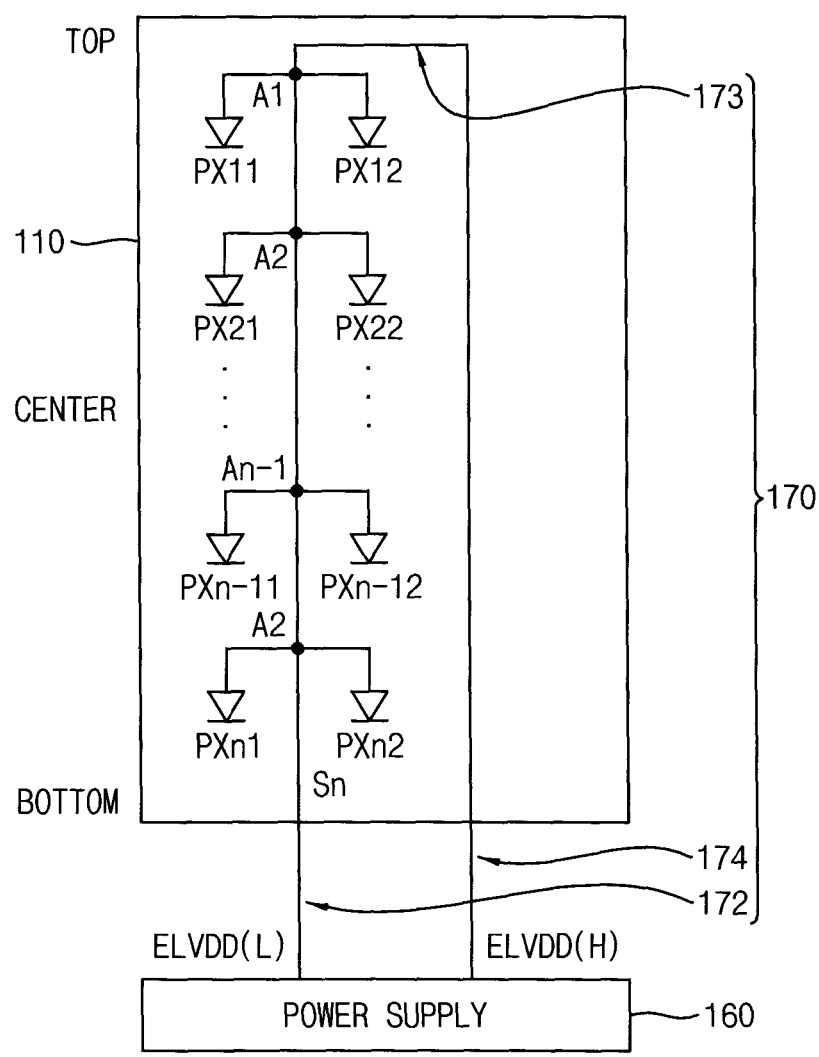
FIG. 6 is a diagram illustrating an example of a power supply voltage line included in an organic light emitting diode display device of FIG. 1.
Figure 7:
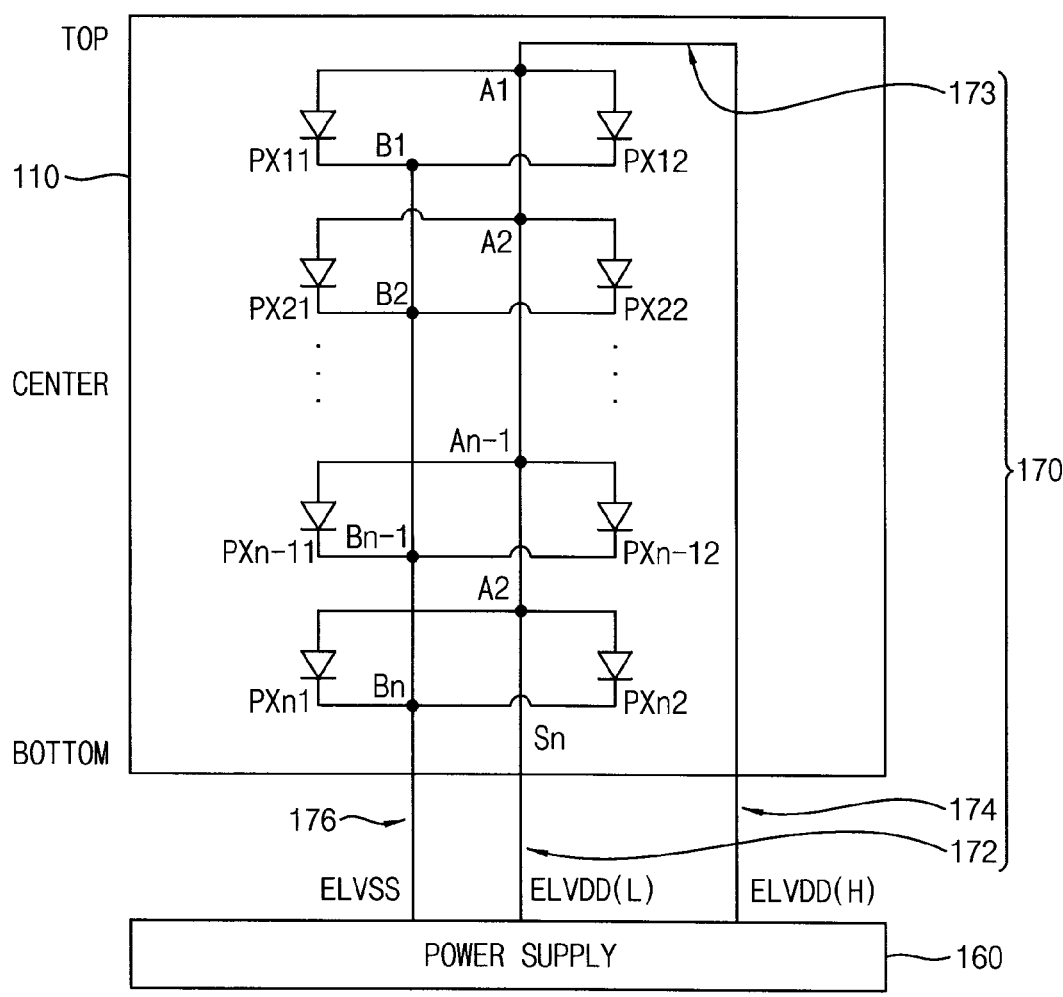
FIG. 7 is a diagram illustrating an example of power supply voltage lines included in an organic light emitting diode display device of FIG. 1.

FIG. 6 is a diagram illustrating an example of a power supply voltage line included in an organic light emitting diode display device of FIG. 1, and FIG. 7 is a diagram illustrating an example of power supply voltage lines included in an organic light emitting diode display device of FIG. 1.

Referring to FIGS. 3, 6 and 7, a display panel 110 may include a first side region BOTTOM, a center region CENTER, and a second side region TOP. A power supply 160 may include a first power supply voltage line 170 and a second power supply voltage line 176. The first power supply voltage line 170 may include a first extension 172, a second extension 173, and a third extension 174.

The first extension 172 may include a first portion located adjacent to the first side region BOTTOM of a display panel 110 and a second portion located adjacent to the second side region TOP of the display panel 110. A width of the first extension 172 may be gradually decreased in a direction (such as for example, a first direction) from the first side region BOTTOM of the display panel 110 to the second side region TOP of the display panel 110 (refer to FIG. 8). The first extension 172 may be connected to the pixels PX.

The third extension 174 may include a third portion located adjacent to the first side region BOTTOM and a fourth portion located adjacent to the second side region TOP. A width of the third extension 174 may be gradually decreased in a direction (such as for example, a third direction) from the second side region TOP to the first side region BOTTOM (refer to FIG. 8).

The second extension 173 may include a fifth portion connected to the second portion of the first extension 172 and a sixth portion connected to the fourth portion of the third extension 174. The second extension 173 may be extended along a direction (such as for example, a second direction) which is perpendicular to the first direction. The second extension 173 may be located adjacent to the second side region TOP. The first extension 172, the second extension 173, and the third extension 174 may be formed as one electrode such as the first power supply voltage line 170 (refer to FIG. 8). The first through third extensions 172 though 174 of the first power supply voltage line 170 may be disposed at the same level, and formed as one body. The second power supply voltage line 176 may include a first end located adjacent to the first side region BOTTOM, and a second end located adjacent to the second side region TOP. The second power supply voltage line 176 may be connected to the pixels PX. In addition, The power supply 160 may generate a first power supply voltage ELVDD(L), a second power supply voltage ELVDD(H), and a third power supply voltage ELVSS. The power supply 160 may be located adjacent to the first side region BOTTOM. The power supply 160 may apply the first through third power supply voltage ELVDD(H), ELVDD(L), and ELVSS to the first portion of the first extension 172, the third portion of the third extension 174, and the first end of the second power supply voltage line 176, respectively.

In example embodiments, the first power supply voltage ELVDD(L) and the second power supply voltage ELVDD(H) may be a high power supply voltage, and the third power supply voltage ELVSS may be a low power supply voltage. A voltage level of the first power supply voltage ELVDD(L) may be relatively lower than a voltage level of the second power supply voltage ELVDD(H).

The first power supply voltage ELVDD(L) may be provided via the first extension 172, the second extension 173, and the third extension 174 from the second side region TOP and the first side region BOTTOM to the center region CENTER. For example, the first power supply voltage ELVDD(L)

applied to the first portion of the first extension 172 may be provided to the pixels PX via the first portion of the first extension 172 and the second portion of the first extension 172 in a direction from the first side region BOTTOM to the second side region TOP. The first power supply voltage ELVDD(L) may be provided to the pixels PX in the first direction.

The second power supply voltage ELVDD(H) applied to the third portion of the third extension 174 may be provided to the pixels PX via the third extension 174, the second extension 173, and the first extension 172 in a direction from the second side region TOP to the first side region BOTTOM. After the second power supply voltage ELVDD(H) may be transferred via the third extension 174 and the second extension 173 in the first direction from the first side region BOTTOM to the second side region TOP, the second power supply voltage ELVDD(H) may be applied to the pixels PX via the first extension 172 in the third direction from the second side region TOP to the first side region BOTTOM. Accordingly, the first power supply voltage ELVDD(L) and the second power supply voltage ELVDD(H) may provided to the pixels PX. A voltage level of the first power supply voltage ELVDD(L) may be lower than that of the second power supply voltage ELVDD(H) such that a voltage level of the first power supply voltage ELVDD(L) provided to the first portion of the first extension 172 is substantially the same as a voltage level of the second power supply voltage ELVDD(H) provided to the second portion of the first extension 172 via the third extension 174 and the second extension 173.

In addition, the third power supply voltage ELVSS may be provided to the pixels PX via the second power supply voltage line 176 from the second side region TOP to the first side region BOTTOM. For example, the third power supply voltage ELVSS applied to the first end of the second power supply voltage line 176 may be provided to the pixels PX via the first end of the second power supply voltage line 176 and the second end of the second power supply voltage line 176 in the direction from the first side region BOTTOM to second side region TOP. Accordingly, the third power supply voltage ELVSS may be provided to the pixels PX.

In example embodiments, the first extension 172 may include the first portion located adjacent to the first side region BOTTOM and the second portion located adjacent to the second side region TOP. The first portion of the first extension 172 may be connected to the power supply 160, and the second portion of the first extension 172 may be connected to the fifth portion of the second extension 173. The third extension 174 may include the third portion located adjacent to the first side region BOTTOM and the fourth portion located adjacent to the second side region TOP. The third portion of the third extension 174 may be connected to the power supply 160, and the fourth portion of the third extension 174 may be connected to the sixth portion of the second extension 173. The second power supply voltage ELVDD(H) provided to the third portion of the third extension 174 may be passed via third extension 174 from the first side region BOTTOM to the second side region TOP. When the second power supply voltage ELVDD(H) is passed via the third extension 174 from the first side region BOTTOM to the second side region TOP, the third extension 174 may not be connected to the pixels PX. At the same time, the first power supply voltage ELVDD(L) may be provided to the first portion of the first extension 172. As the second power supply voltage ELVDD(H) is passed from the first side region BOTTOM to the second side region TOP, the IR drop may occur. Thus, a voltage level of the first power supply voltage ELVDD(L) may be relatively lower than that of the second power supply voltage ELVDD(H) such that a voltage level of the first power supply voltage ELVDD(L) provided to the first portion of the first extension 172 is substantially the same as a voltage level of the second power supply voltage ELVDD(H) provided to the second portion of the first extension 172 via the third extension 174 and the second extension 173.

The display panel 110 may include pixels PX11 through PXnm. For example, the pixel PX11 may be connected to a first scan line SL1 and a first data line DL1, the pixel PX12 may be connected to the first scan line SL1 and a second data line DL2. Similarly, the pixel PXn1 may be connected to an (n)th scan line SLn and the first data line DL1, and the pixel PXn2 may be connected to the (n)th scan line SLn and the second data line DL2. The first extension 172 may include a plurality of branch points. For example, the first extension 172 may include a first branch point A1 through an (n)th branch point An. The first branch point A1 may be connected to the pixel PX11 and the pixel PX12, and the second branch point A2 may be connected to the pixel PX21 and the pixel PX22. Similarly, the (n)th branch point An may be connected to the pixel PXn1 and the pixel PXn2. In particular, each of the pixels PX may include an anode electrode, a cathode electrode opposite to the anode, and an emission layer between the anode electrode and the cathode electrode. Each of the branch points A1 through An may be connected to each of the anode electrode of the pixels PX11 through PXnm. In addition, the second power supply voltage line 176 may include a plurality of branch points. For example, the second power supply voltage line 176 may include a first branch point B1 through an (n)th branch point Bn. The first branch point B1 may be connected to the pixel PX11 and the pixel PX12, and the second branch point B2 may be connected to the pixel PX21 and the pixel PX22. Similarly, the (n)th branch point Bn may be connected to the pixel PXn1 and the pixel PXn2. Each of the branch points B1 through Bn may be connected to each of the cathode electrode of the pixels PX11 through PXnm.

The second power supply voltage ELVDD(H) transferred through the third extension 174 may be applied to the pixel PX11 and the pixel PX12 via the first branch point A1 of the first extension 172. The second power supply voltage ELVDD(H) may be sequentially transferred from the pixel PX11 and the pixel PX12 to the pixels PX located in the center region CENTER. In addition, the first power supply voltage ELVDD(L) transferred through the first extension 172 may be applied to the pixel PXn1 and the pixel PXn2 via the (n)th branch point An of the first extension 172. The first power supply voltage ELVDD(L) may be sequentially transferred from the pixel PXn1 and the pixel PXn2 to the pixels PX located in the center region CENTER of the display panel 110. In this manner, the first power supply voltage ELVDD(L) and the second power supply voltage ELVDD(H) may transferred to the pixels PX11 through PXnm via the branch points A1 through An of the first extension 172 from the first side region BOTTOM and the second side region TOP to the center region CENTER. In addition, the second power supply voltage ELVDD(H) transferred through the third extension 174 and the second extension 173 may be applied to the pixel PXn1 and the pixel PXn2 via the (n)th branch point An of the first extension 172. The second power supply voltage ELVDD(H) may be sequentially transferred from the pixel PXn1 and the pixel PXn2 to the pixels PX located in the center region CENTER of the display panel 110. Further, the third power supply voltage ELVSS transferred through the first end of the second power supply voltage line 176 may be applied to the pixel PXn1 and the pixel PXn2 via the (n)th branch point Bn of the second power supply voltage line 176. The third power supply voltage ELVSS may be sequentially transferred from the pixel PXn1 and the pixel PXn2 to the pixels PX located in the first side region BOTTOM. In this manner, the first power supply voltage ELVDD(L) and the second power supply voltage ELVDD(H) may be transferred to the pixels PX11 through PXnm via the branch points A1 through An of the first extension 172 from the first side region BOTTOM and the second side region TOP to the center region CENTER. The third power supply voltage ELVSS may be transferred to the pixels PX11 through PXnm via the branch points B1 through Bn of the second power supply voltage line 176 from the first side region BOTTOM to the second side region TOP.

The above description describes that one branch point illustrated in FIGS. 6 and 7 is connected to two pixels, but the branch point may be connected to one pixel or at least two pixels in other embodiments.

Figure 8:
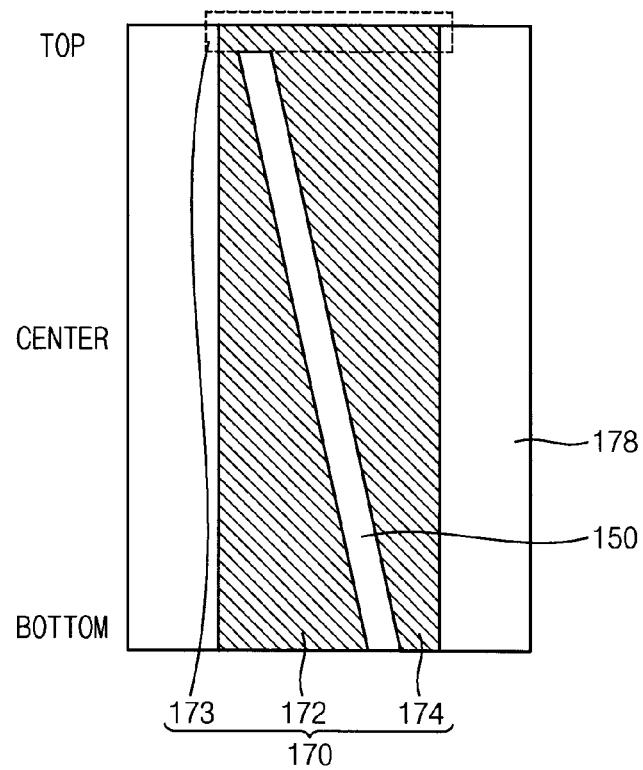
FIG. 8 is a plan view illustrating a power supply voltage line illustrated in FIG. 6.
Figure 9:
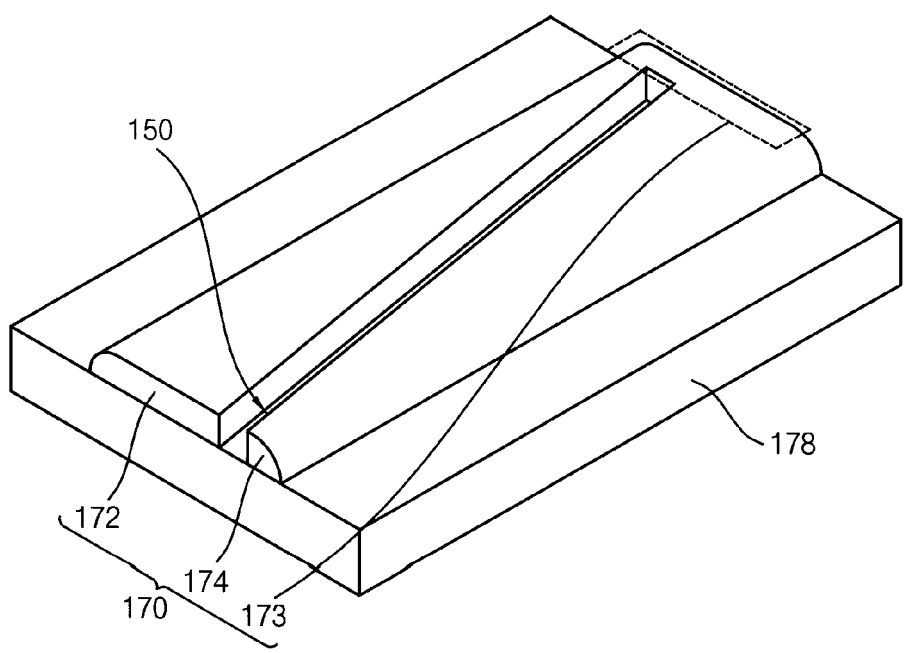
FIG. 9 is a perspective view illustrating a power supply voltage line of FIG. 8.

FIG. 8 is a plan view illustrating a power supply voltage line illustrated in FIG. 6, and FIG. 9 is a perspective view illustrating a power supply voltage line of FIG. 8.

Referring to FIGS. 6 through 9, a first power supply voltage line 170 may include a first extension 172, a second extension 173, a third extension 174, and a separation region 150. The first power supply voltage line 170 (such as for example, a high power supply voltage line) may be disposed on an insulating layer 178. A display panel 110 may separate a first side region BOTTOM, a center region CENTER, and a second side region TOP. The power supply 160 may be connected to the first power supply voltage line 170 and a second power supply voltage line 176.

The first extension 172 may be disposed along a first direction (for example, a direction from the first side region BOTTOM to the second side region TOP). The second extension 173 may be disposed along a second direction perpendicular to the first direction. The third extension 174 may be disposed along a third direction opposite to the first direction. The first direction may be parallel to the third direction. In some embodiments, the first extension 172, the second extension 173, and the third extension 174 may be disposed at the same level, and formed as one body.

The first extension 172 may include a first portion located adjacent to the first side region BOTTOM of a display panel 110 and a second portion located adjacent to the second side region TOP of the display panel 110. A width of the first extension 172 may be gradually decreased in the first direction. The first extension 172 may be connected to pixels PX. Since the first extension 172 includes the gradually decreasing width, each of the pixels PX connected to the first extension 172 may be connected to each of different widths of the first extension 172.

The third extension 174 may include a third portion located adjacent to the first side region BOTTOM and a fourth portion located adjacent to the second side region TOP. A width of the third extension 174 may be gradually increased in the first direction. The width of the third extension 174 may be gradually decreased in the third direction. When a second power supply voltage ELVDD(H) may be transferred via the third extension 174 in the first direction, the third extension 174 may not be connected to the pixels PX.

The second extension 173 may include a fifth portion connected to the second portion of the first extension 172 and a sixth portion connected to the fourth portion of the third extension 174. The second extension 173 may be extended along the second direction. The second extension 173 may be located adjacent to the second side region TOP.

The separation region 150 may include a first end located adjacent to the first side region BOTTOM and a second end located adjacent to the second side region TOP. The first end of the separation region 150 may be opened in the third direction, and the second end of the separation region 150 may be closed in the first direction by the second extension 173. The separation region 150 may be interposed between the first extension 172 and the third extension 174 such that the first extension 172 and the third extension 174 are separated. In example embodiments, the separation region 150 may include a line-shaped opening and a bar-shaped opening. In a forming process of the separation region 150, as an OLED display device 100 becomes larger, a size of the display panel 110 may be increased. In addition, a width of the first power supply voltage line 170 may be increased. Thus, the separation region 150 may be formed in the first power supply voltage line 170. For example, after a line-shaped or a bar-shaped power supply voltage line is formed on the insulating layer 178, the separation region 150 having a line-shaped opening or a bar-shaped opening may be formed in the power supply voltage line using a mask. The power supply voltage line having the separation region 150 may be defined as the first power supply voltage line 170. An additional insulating layer may be formed on the first power supply voltage line 170, and the separation region 150 may be filled with the additional insulating layer. As illustrated in FIG. 9, the first extension 172, the second extension 173, the third extension 174, and the separation region 150 may be formed as one electrode.

The power supply 160 may generate a first power supply voltage ELVDD(L), a second power supply voltage ELVDD (H), and a third power supply voltage ELVSS. The power supply 160 may be located adjacent to the first side region BOTTOM. The power supply 160 may apply the first through third power supply voltages ELVDD(H), ELVDD(L), and ELVSS to the first portion of the first extension 172, the third portion of the third extension 174, and the first end of the second power supply voltage line 176, respectively. In example embodiments, the first power supply voltage ELVDD(L) may be applied to the first extension 172, and the second power supply voltage ELVDD(H) may be applied to the third extension 174. A voltage level of the first power supply voltage ELVDD(L) may be lower than that of the second power supply voltage ELVDD(H) such that a voltage level of the first power supply voltage ELVDD(L) provided to the first portion of the first extension 172 is substantially the same as a voltage level of the second power supply voltage ELVDD(H) provided to the second portion of the first extension 172 via the third extension 174 and the second extension 173.

As described above, as the OLED display device 100 includes the first power supply voltage line 170 having the separation region 150, an IR drop generated in the display panel 110 may be reduced. In addition, as the OLED display device 100 includes one power supply 160 and one electrode (for example, the first power supply voltage line 170), the OLED display device 100 may implement a dual bank method. Further, compared to a single bank method, the OLED display device 100 including the first power supply voltage line 170 may improve an LRU.

As illustrated in FIGS. 8 and 9, the first power supply voltage ELVDD(L) and the second power supply voltage ELVDD(H) are applied to the first extension 172 and the third extension 174, respectively, but the first power supply voltage ELVDD(L) may be applied to the third extension 174. Also, the second power supply voltage ELVDD(H) may be applied to the first extension 172.

Figure 10:
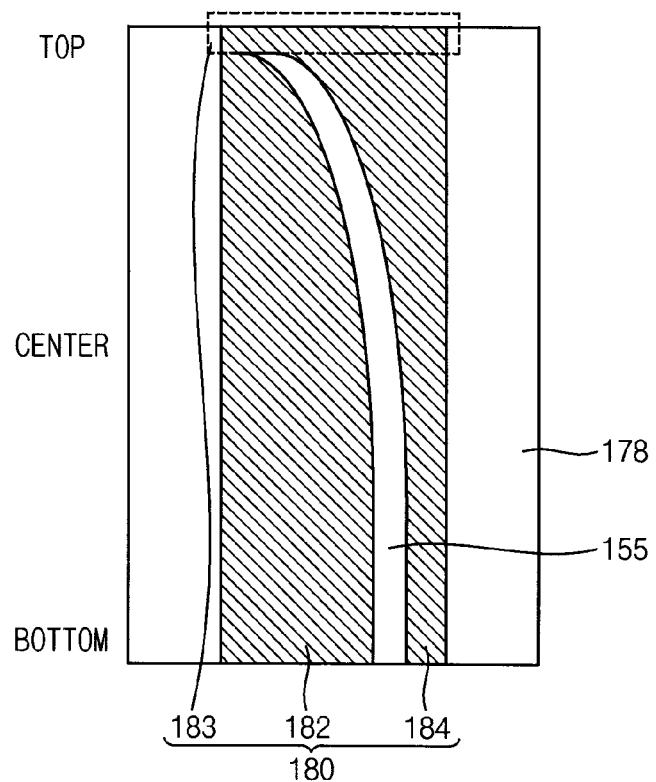
FIG. 10 is a plan view illustrating a power supply voltage line in accordance with some example embodiments.

FIG. 10 is a plan view illustrating a power supply voltage line in accordance with some example embodiments. A first power supply voltage line 180 illustrated in FIG. 10 may have a configuration substantially the same as or similar to that of the first power supply voltage line 170 described with reference to FIGS. 7 through 9 except a separation region 155. In FIG. 10, detailed descriptions for elements, which are substantially the same as or similar to the elements described with reference to FIGS. 7 through 9, will be omitted.

Referring to FIG. 10, a first power supply voltage line 180 may include a first extension 182, a second extension 183, a third extension 184, and a separation region 155. The first power supply voltage line 180 (for example, a high power supply voltage line) may be disposed on an insulating layer 178. A display panel 110 may separate a first side region BOTTOM, a center region CENTER, and a second side region TOP. The power supply 160 may be connected to the first power supply voltage line 180 and a second power supply voltage line.

The first extension 182 may be disposed along a first direction (for example, a direction from the first side region BOTTOM to the second side region TOP). The second extension 183 may be disposed along a second direction perpendicular to the first direction. The third extension 184 may be disposed along a third direction opposite to the first direction. The first direction may be parallel to the third direction. The first extension 182, the second extension 183, and the third extension 184 may be disposed at the same level, and formed as one body.

The first extension 182 may include a first portion located adjacent to the first side region BOTTOM of a display panel 110 and a second portion located adjacent to the second side region TOP of the display panel 110. A width of the first extension 182 may be gradually decreased in the first direction. The first extension 182 may be connected to pixels PX. Since the first extension 182 includes the gradually decreasing width, each of the pixels PX connected to the first extension 182 may be connected to each of different widths of the first extension 182.

The third extension 184 may include a third portion located adjacent to the first side region BOTTOM and a fourth portion located adjacent to the second side region TOP. A width of the third extension 184 may be gradually increased in the first direction. The width of the third extension 184 may be gradually decreased in the third direction. When a second power supply voltage ELVDD(H) may be transferred via the third extension 184 in the first direction, the third extension 184 may not be connected to the pixels PX.

The second extension 183 may include a fifth portion connected to the second portion of the first extension 182 and a sixth portion connected to the fourth portion of the third extension 184. The second extension 183 may be extended along the second direction. The second extension 183 may be located adjacent to the second side region TOP.

The separation region 155 may include a first end located adjacent to the first side region BOTTOM and a second end located adjacent to the second side region TOP. The first end of the separation region 155 may be opened in the third direction, and the second end of the separation region 155 may be closed in the first direction by the second extension 183. The separation region 155 may be interposed between the first extension 182 and the third extension 184 such that the first extension 182 and the third extension 184 are separated. In example embodiments, the separation region 155 may include a curve-shaped opening. In a forming process of the separation region 155, as an OLED display device becomes larger, a size of the display panel 110 may be increased. In addition, a width of the first power supply voltage line 180 may be increased. Thus, the separation region 155 may be formed in the first power supply voltage line 180. For example, after a line-shaped or a bar-shaped power supply voltage line is formed on the insulating layer 178, the separation region 155 having a curve-shaped opening may be formed in the power supply voltage line using a mask. The power supply voltage line having the separation region 155 may be defined as the first power supply voltage line 180. An additional insulating layer may be formed on the first power supply voltage line 180, and the separation region 155 may be filled with the additional insulating layer. As the separation region 155 includes the curve-shaped opening, a width of the first extension 182 may be relatively large, compared to a width of the first extension 172 illustrated in FIG. 8. For example, the curve in the curve-shaped opening may be formed such that a slope from the first side region BOTTOM to the center region CENTER is less than a slope from the center region CENTER to the second side region TOP. Accordingly, as the first extension 182 is connected to the pixels PX, an IR drop generated in the first extension 182 may be improved. As illustrated in FIG. 10, the first extension 182, the second extension 183, the third extension 184, and separation region 155 may be formed as one electrode.

The power supply 160 may generate a first power supply voltage ELVDD(L), a second power supply voltage ELVDD (H), and a third power supply voltage ELVSS. The power supply 160 may be located adjacent to the first side region BOTTOM. The power supply 160 may apply the first through third power supply voltage ELVDD(H), ELVDD(L), and ELVSS to the first portion of the first extension 182, the third portion of the third extension 184, and a first end of the second power supply voltage line, respectively. In example embodiments, the first power supply voltage ELVDD(L) may be applied to the first extension 182, and the second power supply voltage ELVDD(H) may be applied to the third extension 184. A voltage level of the first power supply voltage ELVDD(L) may be lower than that of the second power supply voltage ELVDD(H) such that a voltage level of the first power supply voltage ELVDD(L) provided to the first portion of the first extension 182 is substantially the same as a voltage level of the second power supply voltage ELVDD(H) provided to the second portion of the first extension 182 via the third extension 184 and the second extension 183.

As described above, as the OLED display device includes the first power supply voltage line 180 having the separation region 155, an IR drop generated in the first extension 182 of the first power supply voltage line 180 may be reduced, compared to a width of the first extension 172 illustrated in FIG. 8. In addition, as the OLED display device includes one power supply 160 and one electrode (for example, the first power supply voltage line 180), the OLED display device 100 may implement a dual bank method. Further, compared to a single bank method, the OLED display device including the first power supply voltage line 180 may improve an LRU.

As illustrated in FIG. 10, the first power supply voltage ELVDD(L) and the second power supply voltage ELVDD(H) are applied to the first extension 182 and the third extension 184, respectively, but the first power supply voltage ELVDD (L) may be applied to the third extension 184 in other embodiments. Also, the second power supply voltage ELVDD(H) may be applied to the first extension 182.

Figure 11:
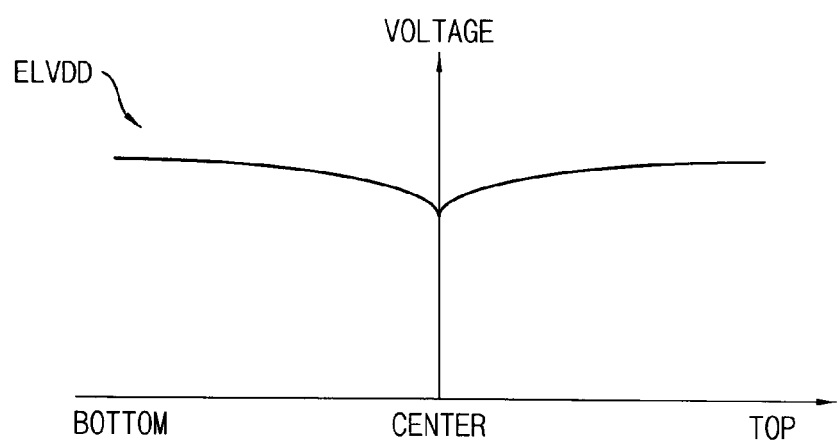
FIG. 11 is a graph illustrating an example of a high power supply voltage of a display panel including a power supply voltage line of FIG. 8.

FIG. 11 is a graph illustrating an example of a high power supply voltage of a display panel including a power supply voltage line of FIG. 8. A vertical axis of FIG. 11 is a magnitude of a voltage level, and a horizontal axis is a first end portion BOTTOM, a center region CENTER, and a second end portion TOP of a display panel 110 illustrated in FIG. 3.

Referring to FIGS. 3, 8, and 11, a power supply 160 of an OLED display device may be located adjacent to the first side region BOTTOM of the display panel 110. Meanwhile, as the OLED display device is implemented as a dual bank method using a first power supply voltage line 170, the OLED display device may simultaneously provide a high power supply voltage to the first and second end portions BOTTOM and TOP of the display panel 110. Compared to a dual bank illustrated in FIG. 5, the OLED display device may improve an IR drop generated in the high power supply voltage. In addition, an LRU may be improved. Further, a consumption of a component of the OLED display device and a manufacturing cost may be decreased. When the components are not added in the OLED display device, a dead space of the OLED display device may be reduced.

Figure 12:
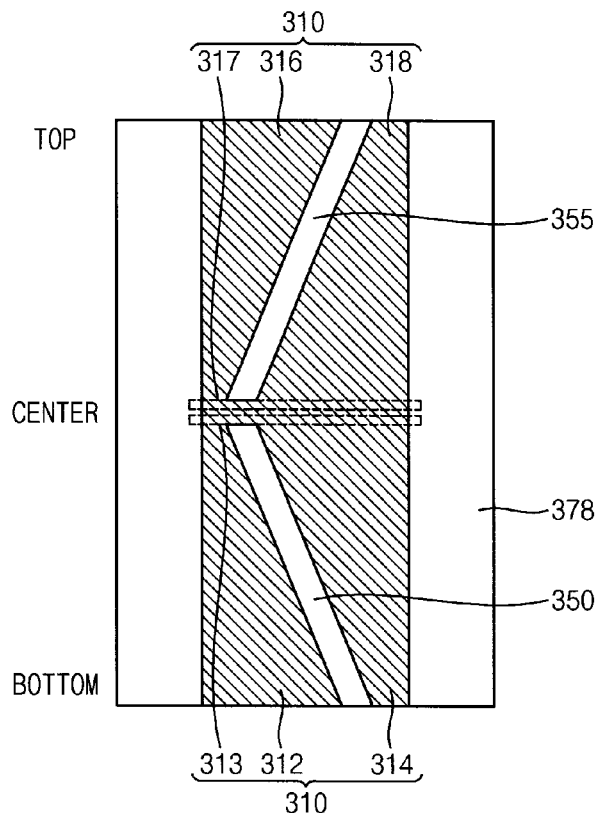
FIG. 12 is a plan view illustrating a power supply voltage line in accordance with some example embodiments.
Figure 13:
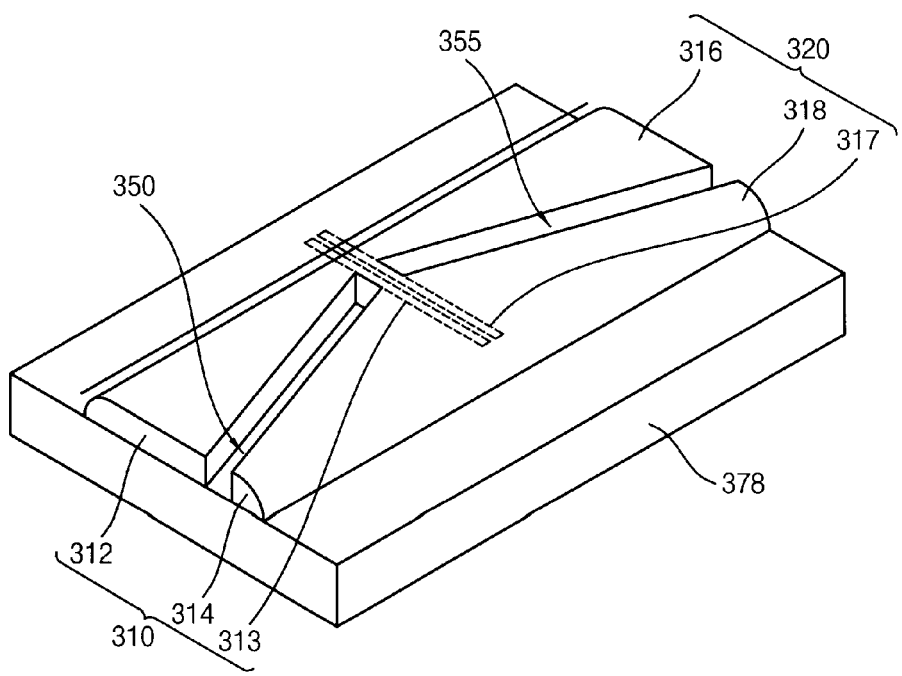
FIG. 13 is a perspective view illustrating a power supply voltage line of FIG. 12.

FIG. 12 is a plan view illustrating a power supply voltage line in accordance with still some example embodiments, and FIG. 13 is a perspective view illustrating a power supply voltage line of FIG. 12. A first power supply voltage line 310 and a third power supply voltage line 320 illustrated in FIGS. 12 and 13 may have a configuration substantially the same as or similar to that of the first power supply voltage line 170 described with reference to FIGS. 7 through 9. In FIGS. 12 and 13, detailed descriptions for elements, which are substantially the same as or similar to the elements described with reference to FIGS. 7 through 9, will be omitted.

Referring to FIGS. 12 and 13, a first power supply voltage line 310 may include a first extension 312, a second extension 313, a third extension 314, and a first separation region 350. The third power supply voltage line 320 may include a fourth extension 316, a fifth extension 317, a sixth extension 318, and a second separation region 355. The first power supply voltage line 310 and third power supply voltage line 320 (for example, a high power supply voltage line) may be disposed on an insulating layer 378. A display panel 110 may separate a first side region BOTTOM, a center region CENTER, and a second side region TOP. A first power supply may be connected to the first power supply voltage line 310 and a second power supply voltage line, and a second power supply may be connected to the third power supply voltage line 320 and a fourth power supply voltage line. The first extension 312 may be disposed along a first direction (for example, a direction from the first side region BOTTOM to the second side region TOP). The second extension 313 may be disposed along a second direction perpendicular to the first direction. The third extension 314 may be disposed along a third direction opposite to the first direction. The first direction may be parallel to the third direction. In addition, the fourth extension 316 may be disposed along the third direction. The fifth extension 317 may be disposed along the second direction. The sixth extension 318 may be disposed along the first direction. The first extension 312, the second extension 313, the third extension 314, the fourth extension 316, the fifth extension 317, and the sixth extension 318 may be disposed at the same level, and formed as one body.

The first extension 312 may include a first portion located adjacent to the first side region BOTTOM of a display panel 110 and a second portion located adjacent to the center region CENTER of the display panel 110. A width of the first extension 312 may be gradually decreased in the first direction. The first extension 312 may be connected to pixels PX. Since the first extension 312 includes the gradually decreasing width, each of the pixels PX connected to the first extension 312 may be connected to each of different widths of the first extension 312.

The third extension 314 may include a third portion located adjacent to the first side region BOTTOM and a fourth portion located adjacent to the center region CENTER. A width of the third extension 314 may be gradually increased in the first direction. The width of the third extension 314 may be gradually decreased in the third direction. When a second power supply voltage ELVDD(H) may be transferred via the third extension 314 in the first direction (for example, a direction from the first side region BOTTOM to the center region CENTER), the third extension 314 may not be connected to the pixels PX.

The second extension 313 may include a fifth portion connected to the second portion of the first extension 312 and a sixth portion connected to the fourth portion of the third extension 314. The second extension 313 may be extended along the second direction. The second extension 313 may be located adjacent to the center region CENTER.

The fourth extension 316 may include a seventh portion located adjacent to the second side region TOP of a display panel 110 and an eighth portion located adjacent to the center region CENTER of the display panel 110. A width of the fourth extension 316 may be gradually decreased in the third direction. The fourth extension 316 may be connected to pixels PX. Since the fourth extension 316 includes the gradually decreasing width, each of the pixels PX connected to the fourth extension 316 may be connected to each of different widths of the fourth extension 316.

The sixth extension 318 may include a ninth portion located adjacent to the second side region TOP and a tenth portion located adjacent to the center region CENTER. A width of the sixth extension 318 may be gradually increased in the third direction. The width of the sixth extension 318 may be gradually decreased in the first direction. When a second power supply voltage ELVDD(H) may be transferred via the sixth extension 318 in the third direction (for example, a direction from the second side region TOP to the center region CENTER), the sixth extension 318 may not be connected to the pixels PX.

The fifth extension 317 may include an eleventh portion connected to the eighth portion of the fourth extension 316 and a twelfth portion connected to the tenth portion of the sixth extension 318. The fifth extension 317 may be extended along the second direction. The fifth extension 317 may be located adjacent to the center region CENTER.

The first separation region 350 may include a first end located adjacent to the first side region BOTTOM and a second end located adjacent to the center region CENTER. The first end of the first separation region 350 may be opened in the third direction, and the second end of the first separation region 350 may be closed in the first direction by the second extension 313. The first separation region 350 may be interposed between the first extension 312 and the third extension 314 such that the first extension 312 and the third extension 314 are separated. In example embodiments, the first separation region 350 may include a line-shaped opening or a bar-shaped opening.

The second separation region 355 may include a first end located adjacent to the second side region TOP and a second end located adjacent to the center region CENTER. The first end of the second separation region 355 may be opened in the first direction, and the second end of the second separation region 355 may be closed in the third direction by the fifth extension 317. The second separation region 355 may be interposed between the fourth extension 316 and the sixth extension 318 such that the fourth extension 316 and the sixth extension 318 are separated. In example embodiments, the second separation region 355 may include a line-shaped opening or a bar-shaped opening.

In a forming process of the first and second separation regions 350 and 355, as an OLED display device becomes larger, a size of the display panel 110 may be increased. In addition, widths of the first power supply voltage line 310 and third power supply voltage line 320 may be increased. Thus, the first and second separation regions 350 and 355 may be formed in the first and third power supply voltage lines 310 and 320. For example, after a line-shaped or a bar-shaped power supply voltage line is formed on the insulating layer 378, the first and second separation regions 350 and 355 having a line-shape or a bar-shape may be formed in the power supply voltage line using a mask. The power supply voltage line having the first and second separation regions 350 and 355 may be defined as the first and third power supply voltage lines 310 and 320. An additional insulating layer may be formed on the first and third power supply voltage lines 310 and 320, and the first and second separation regions 350 and 355 may be filled with the additional insulating layer. As illustrated in FIG. 13, the first extension 312, the second extension 313, the third extension 314, the fourth extension 316, the fifth extension 317, the sixth extension 318, the first separation region 350, and the second separation region 355 may be formed as one electrode.

The first and second power supplies may generate a first power supply voltage ELVDD(L), a second power supply voltage ELVDD(H), and a third power supply voltage ELVSS. The first and second power supplies may be located adjacent to the first side region BOTTOM and the second side region TOP, respectively. The first power supply may apply the first through third power supply voltages ELVDD(H), ELVDD(L), and ELVSS to the first portion of the first extension 312, the third portion of the third extension 314, and the first end of the second power supply voltage line, respectively. Similarly, the second power supply may apply the first through third power supply voltages ELVDD(H), ELVDD (L), and ELVSS to the seventh portion of the fourth extension 316, the ninth portion of the sixth extension 318, and the first end of the fourth power supply voltage line, respectively. In example embodiments, the first power supply voltage ELVDD(L) may be applied to the first extension 312 and to the fourth extension 316, and the second power supply voltage ELVDD(H) may be applied to the third extension 314 and to the sixth extension 316. A voltage level of the first power supply voltage ELVDD(L) may be lower than that of the second power supply voltage ELVDD(H) such that a voltage level of the first power supply voltage ELVDD(L) provided to the first portion of the first extension 312 is substantially the same as a voltage level of the second power supply voltage ELVDD(H) provided to the second portion of the first extension 312 via the third extension 314 and the second extension 313. In addition, a voltage level of the first power supply voltage ELVDD(L) may be lower than that of the second power supply voltage ELVDD(H) such that a voltage level of the first power supply voltage ELVDD(L) provided to the seventh portion of the fourth extension 316 is substantially the same as a voltage level of the second power supply voltage ELVDD(H) provided to the eighth portion of the fourth extension 316 via the sixth extension 318 and the second extension 313.

In example embodiments, the second power supply voltage ELVDD(H) provided to the third portion of the third extension 314 may be transferred to the second portion of the first extension 312 or the eighth portion of the fourth extension 316. Similarly, the second power supply voltage ELVDD(H) provided to the ninth portion of the sixth extension 318 may be transferred to the second portion of the first extension 312 or the eighth portion of the fourth extension 316. For example, when an image is displayed in the display panel 110, luminance of the first side region BOTTOM, the second side region TOP, and the center region CENTER may be different. In this case, the second power supply voltage ELVDD(H) provided to the third extension 314 and the sixth extension 318 may be transferred to a region (for example, the first side region BOTTOM, the second side region TOP, and the center region CENTER) where the pixels PX displayed by a high luminance image is located. Accordingly, an LRU of the OLED display device may be improved.

In example embodiments, when the first power supply voltage ELVDD(L) and the second power supply voltage ELVDD(H) are used, a luminance of the center region CENTER of the display panel 110 may be relatively high, compared to the first side region BOTTOM and the first side region BOTTOM. In this case, after a current of the second power supply voltage ELVDD(H) applied to the third and sixth extension 314 and 318 is measured, the adjusted voltage first power supply voltage ELVDD(L) may be applied to the first extension 312 and the fourth extension 316 by adjusting a voltage level of the first power supply voltage ELVDD(L). Accordingly, an LRU of the OLED display device may be improved.

In example embodiments, compared to the first side region BOTTOM and the second side region TOP, when a luminance of the center region CENTER of the display panel 110 is relatively high, an image of the display panel 110 may be examined. A total current of the display panel 110 is calculated, and then a voltage level of the first power supply voltage ELVDD(L) and the second power supply voltage ELVDD(H) may be determined according to a calculated data (such as for example, in a look up table). Accordingly, an LRU of the OLED display device may be improved.

As described above, as the OLED display device includes the first power supply voltage line 310 having the first separation region 350 and the third power supply voltage line 320 having the second separation region 355, an IR drop generated in the first extension 312 of the first power supply voltage line 310 and the fourth extension 316 of the third power supply voltage line 320 may be reduced. In addition, compared to the OLED display device 100 of FIG. 8 having the first power supply voltage line 170, the OLED display device including the first power supply voltage line 310 and the third power supply voltage line 320 may relatively improve an LRU.

As illustrated in FIG. 12, the first power supply voltage ELVDD(L) is applied to the first extension 312 and the fourth extension 316, but the first power supply voltage ELVDD(L) may be applied to the third extension 314 and the sixth extension 318 in other embodiments. Also, the second power supply voltage ELVDD(H) is applied to the third extension 314 and the sixth extension 318, but the second power supply voltage ELVDD(H) may be applied to the first extension 312 and the fourth extension 316 in other embodiments.

Figure 14:
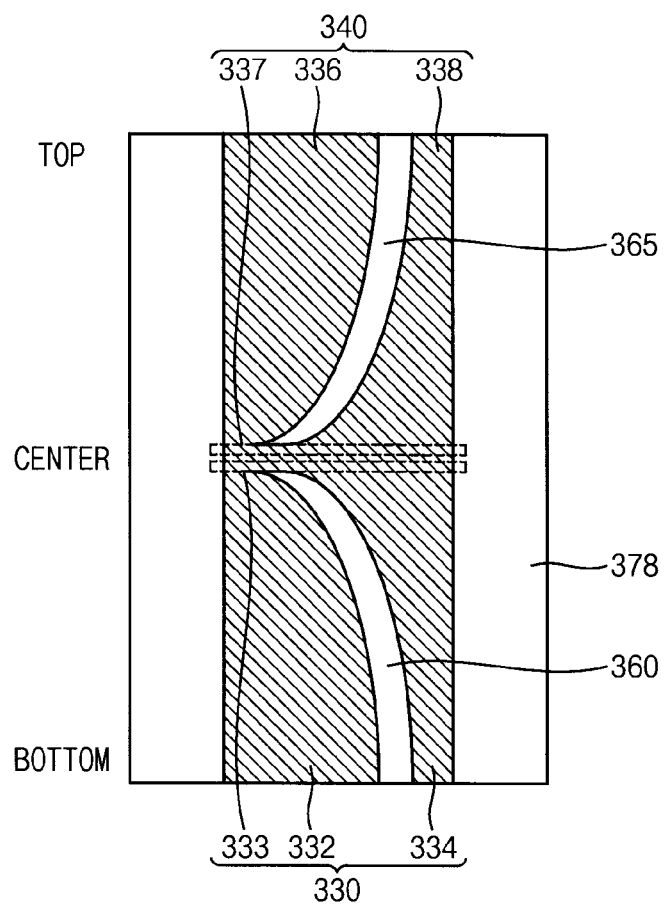
FIG. 14 is a plan view illustrating a power supply voltage line in accordance with some example embodiments.

FIG. 14 is a plan view illustrating a power supply voltage line in accordance with some example embodiments. A first power supply voltage line 330 and a third power supply voltage line 340 illustrated in FIG. 14 may have a configuration substantially the same as or similar to that of the first power supply voltage line 310 and the third power supply voltage line 320 described with reference to FIGS. 12 and 13 except the first separation region 350 and the second separation region 355. In FIG. 14, detailed descriptions for elements, which are substantially the same as or similar to the elements described with reference to FIGS. 12 and 13, will be omitted.

Referring to FIG. 14, a first power supply voltage line 330 may include a first extension 332, a second extension 333, a third extension 334, and a first separation region 360. The third power supply voltage line 340 may include a fourth extension 336, a fifth extension 337, a sixth extension 338, and a second separation region 365. The first power supply voltage line 330 and third power supply voltage line 340 may be disposed on an insulating layer 378. A display panel 110 may separate a first side region BOTTOM, a center region CENTER, and a second side region TOP. A first power supply may be connected to the first power supply voltage line 330 and a second power supply voltage line, and a second power supply may be connected to the third power supply voltage line 340 and a fourth power supply voltage line.

The first extension 332 may be disposed along a first direction (for example, a direction from the first side region BOTTOM to the second side region TOP). The second extension 333 may be disposed along a second direction perpendicular to the first direction. The third extension 334 may be disposed along a third direction opposite to the second direction. The first direction may be parallel to the third direction. In addition, the fourth extension 336 may be disposed along the third direction. The fifth extension 337 may be disposed along the second direction. The sixth extension 338 may be disposed along the first direction. The first extension 332, the second extension 333, the third extension 334, the fourth extension 336, the fifth extension 337, and the sixth extension 338 may be disposed at the same level, and formed as one body.

The first extension 332 may include a first portion located adjacent to the first side region BOTTOM of a display panel 110 and a second portion located adjacent to the center region CENTER of the display panel 110. A width of the first extension 332 may be gradually decreased in the first direction. The first extension 332 may be connected to pixels PX. Since the first extension 332 includes the gradually decreasing width, each of the pixels PX connected to the first extension 332 may be connected to each of different widths of the first extension 332.

The third extension 334 may include a third portion located adjacent to the first side region BOTTOM and a fourth portion located adjacent to the center region CENTER. A width of the third extension 334 may be gradually increased in the first direction. The width of the third extension 334 may be gradually decreased in the third direction. When a second power supply voltage ELVDD(H) may be transferred via the third extension 334 in the first direction (for example, a direction from the first side region BOTTOM to the center region CENTER), the third extension 334 may not be connected to the pixels PX.

The second extension 333 may include a fifth portion connected to the second portion of the first extension 332 and a sixth portion connected to the fourth portion of the third extension 334. The second extension 333 may be extended along the second direction. The second extension 333 may be located adjacent to the center region CENTER.

The fourth extension 336 may include a seventh portion located adjacent to the second side region TOP of a display panel 110 and an eighth portion located adjacent to the center region CENTER of the display panel 110. A width of the fourth extension 336 may be gradually decreased in the third direction. The fourth extension 336 may be connected to pixels PX. Since the fourth extension 336 includes the gradually decreasing width, each of the pixels PX connected to the fourth extension 336 may be connected to each of different widths of the fourth extension 336.

The sixth extension 338 may include a ninth portion located adjacent to the second side region TOP and a tenth portion located adjacent to the center region CENTER. A width of the sixth extension 338 may be gradually increased in the third direction. The width of the sixth extension 338 may be gradually decreased in the first direction. When a second power supply voltage ELVDD(H) may be transferred via the sixth extension 338 in the third direction (for example, a direction from the second side region TOP to the center region CENTER), the sixth extension 338 may not be connected to the pixels PX.

The fifth extension 337 may include an eleventh portion connected to the eighth portion of the fourth extension 336 and a twelfth portion connected to the tenth portion of the sixth extension 338. The fifth extension 337 may be extended along the second direction. The fifth extension 337 may be located adjacent to the center region CENTER.

The first separation region 360 may include a first end located adjacent to the first side region BOTTOM and a second end located adjacent to the center region CENTER. The first end of the first separation region 360 may be opened in the third direction, and the second end of the first separation region 360 may be closed in the first direction by the second extension 333. The first separation region 360 may be interposed between the first extension 332 and the third extension 334 such that the first extension 332 and the third extension 334 are separated. In example embodiments, the first separation region 360 may include a curve-shaped opening.

The second separation region 365 may include a first end located adjacent to the second side region TOP and a second end located adjacent to the center region CENTER. The first end of the second separation region 365 may be opened in the first direction, and the second end of the second separation region 365 may be closed in the third direction by the fifth extension 337. The second separation region 365 may be interposed between the fourth extension 336 and the sixth extension 338 such that the fourth extension 336 and the sixth extension 338 are separated. In example embodiments, the second separation region 365 may include a curve-shaped opening or a bar-shaped opening.

In a forming process of the first and second separation regions 360 and 365, as an OLED display device becomes larger, a size of the display panel 110 may be increased. In addition, widths of the first power supply voltage line 330 and third power supply voltage line 340 may be increased. Thus, the first and second separation regions 360 and 365 may be formed in the first and third power supply voltage lines 330 and 340. For example, after a line-shaped or a bar-shaped power supply voltage line is formed on the insulating layer 378, the first and second separation regions 360 and 365 having a curve-shaped may be formed in the power supply voltage line using a mask. The power supply voltage line having the first and second separation regions 360 and 365 may be defined as the first and third power supply voltage lines 330 and 340. An additional insulating layer may be formed on the first and third power supply voltage lines 330 and 340, and the first and second separation regions 360 and 365 may be filled with the additional insulating layer. As the first and second separation regions 360 and 365 include the curve-shaped opening, widths of the first extension 332 and the fourth extension 336 may be relatively large, compared to widths of the first extension 312 and a fourth extension 316 illustrated in FIG. 12. Accordingly, as the first and fourth extensions 332 and 336 are connected to the pixels PX, an IR drop generated in the first and fourth extensions 332 and 336 may be improved. As illustrated in FIG. 14, the first extension 332, the second extension 333, the third extension 334, the fourth extension 336, the fifth extension 337, the sixth extension 338, the first separation region 360, and the second separation region 365 may be formed as one electrode.

The first and second power supplies may generate a first power supply voltage ELVDD(L), a second power supply voltage ELVDD(H), and a third power supply voltage ELVSS. The first and second power supplies may be located adjacent to the first side region BOTTOM and the second side region TOP, respectively. The first power supply may apply the first through third power supply voltages ELVDD(H), ELVDD(L), and ELVSS to the first portion of the first extension 332, the third portion of the third extension 334, and the first end of the second power supply voltage line, respectively. Similarly, the second power supply may apply the first through third power supply voltages ELVDD(H), ELVDD(L), and ELVSS to the seventh portion of the fourth extension 336, the ninth portion of the sixth extension 338, and the first end of the fourth power supply voltage line, respectively. In example embodiments, the first power supply voltage ELVDD(L) may be applied to the first extension 332 and to the fourth extension 336, and the second power supply voltage ELVDD(H) may be applied to the third extension 334 and to the sixth extension 336. A voltage level of the first power supply voltage ELVDD(L) may be lower than that of the second power supply voltage ELVDD(H) such that a voltage level of the first power supply voltage ELVDD(L) provided to the first portion of the first extension 332 is substantially the same as a voltage level of the second power supply voltage ELVDD(H) provided to the second portion of the first extension 332 via the third extension 334 and the second extension 333. In addition, a voltage level of the first power supply voltage ELVDD(L) may be lower than that of the second power supply voltage ELVDD(H) such that a voltage level of the first power supply voltage ELVDD(L) provided to the seventh portion of the fourth extension 336 is substantially the same as a voltage level of the second power supply voltage ELVDD(H) provided to the eighth portion of the fourth extension 336 via the sixth extension 338 and the second extension 333.

In example embodiments, the second power supply voltage ELVDD(H) provided to the third portion of the third extension 334 may be transferred to the second portion of the first extension 332 or the eighth portion of the fourth extension 336. Similarly, the second power supply voltage ELVDD(H) provided to the ninth portion of the sixth extension 338 may be transferred to the second portion of the first extension 332 or the eighth portion of the fourth extension 336. For example, when an image is displayed in the display panel 110, luminance of the first side region BOTTOM, the second side region TOP, and the center region CENTER may be different. In this case, the second power supply voltage ELVDD(H) provided to the third extension 334 and the sixth extension 338 may be transferred to a region (for example, the first side region BOTTOM, the second side region TOP, and the center region CENTER) where the pixels PX displayed by a high luminance image is located. Accordingly, an LRU of the OLED display device may be improved.

In example embodiments, when the first power supply voltage ELVDD(L) and the second power supply voltage ELVDD(H) are used, a luminance of the center region CENTER of the display panel 110 may be relatively high, compared to the first side region BOTTOM and the second side region TOP. In this case, after a current of the second power supply voltage ELVDD(H) applied to the third and sixth extensions 334 and 338 is measured, the adjusted voltage first power supply voltage ELVDD(L) may be applied to the first extension 332 and the fourth extension 336 by adjusting a voltage level of the first power supply voltage ELVDD(L). Accordingly, an LRU of the OLED display device may be improved.

In example embodiments, compared to the first side region BOTTOM and the second side region TOP, when a luminance of the center region CENTER of the display panel 110 is relatively high, an image of the display panel 110 may be examined. A total current of the display panel 110 is calculated, and then a voltage level of the first power supply voltage ELVDD(L) and the second power supply voltage ELVDD(H) may be determined according to a calculated data (such as for example, with a look up table). Accordingly, an LRU of the OLED display device may be improved.

As described above, as the OLED display device includes the first power supply voltage line 330 having the first separation region 360 and the third power supply voltage line 340 having the second separation region 365, an IR drop generated in the first extension 332 of the first power supply voltage line 330 and the fourth extension 336 of the third power supply voltage line 340 may be reduced, compared to the first extension 312 of the first power supply voltage line 310 and the fourth extension 316 of the third power supply voltage line 320 illustrated in FIG. 12. In addition, the OLED display device including the first power supply voltage line 330 and the third power supply voltage line 340 may relatively improve an LRU of the display panel 110.

As illustrated in FIG. 14, the first power supply voltage ELVDD(L) is applied to the first extension 332 and the fourth extension 336, but the first power supply voltage ELVDD(L) may be applied to the third extension 334 and the sixth extension 338 in other embodiments. Also, the second power supply voltage ELVDD(H) is applied to the third extension 334 and the sixth extension 338, but the second power supply voltage ELVDD(H) may be applied to the first extension 332 and the fourth extension 336 in other embodiments.

Figure 15:
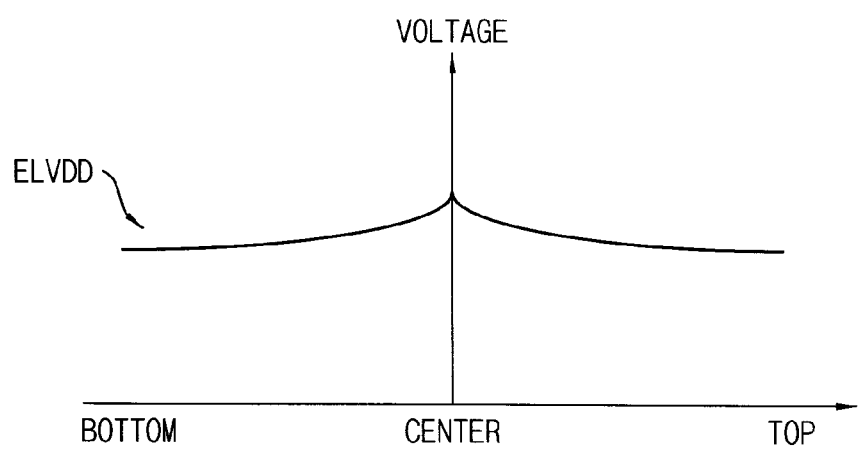
FIG. 15 is a graph illustrating an example of a high power supply voltage of a display panel including a power supply voltage line of FIG. 12.

FIG. 15 is a graph illustrating an example of a high power supply voltage of a display panel including a power supply voltage line of FIG. 12. A vertical axis of FIG. 15 is a magnitude of a voltage level, and a horizontal axis is a first end portion BOTTOM, a center region CENTER, and a second end portion TOP of a display panel 110 illustrated in FIG. 3.

Referring to FIGS. 3, 12, and 15, first and second power supplies of an OLED display device may be located adjacent to the first and second side regions BOTTOM and TOP of the display panel 110, respectively. A high power supply voltage ELVDD may be provided via first and third power supply voltage lines 310 and 320 in a direction from the center region CENTER to the first side region BOTTOM and the second side region TOP. Compared to the OLED display device 100 having the first power supply voltage line 170 illustrated in FIG. 8, the OLED display device an IR drop generated in the high power supply voltage ELVDD may be improved. In addition, an LRU may be improved.

Figure 16:
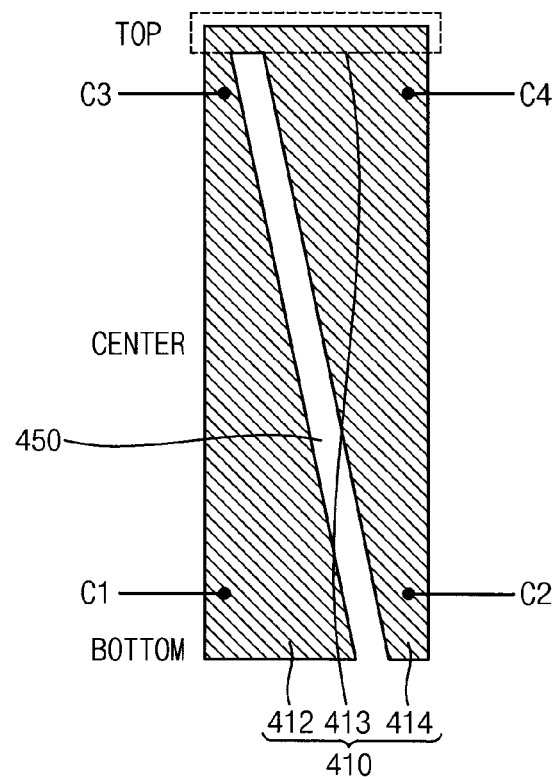
FIG. 16 is a plan view illustrating a power supply voltage line in accordance with some example embodiments.
Figure 17:
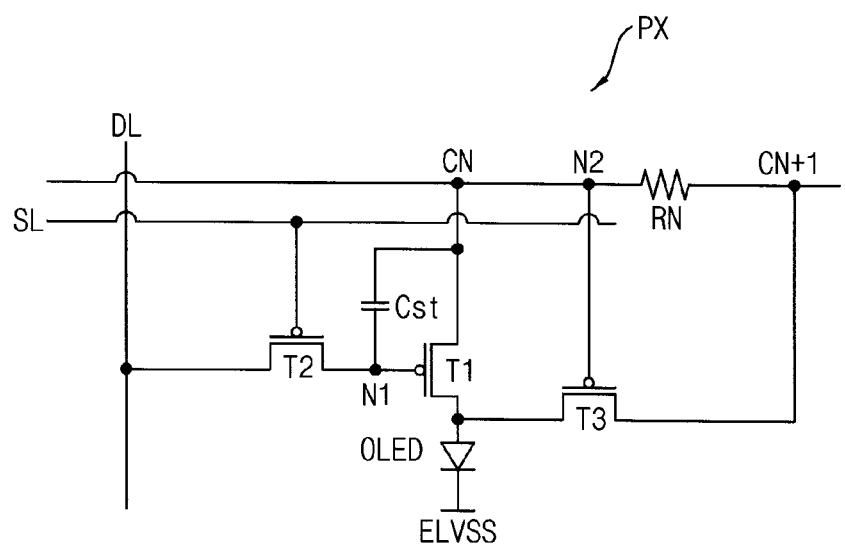
FIG. 17 is a diagram illustrating a transistor compensating a voltage drop generated in a power supply voltage line of FIG. 16.
Figure 18:
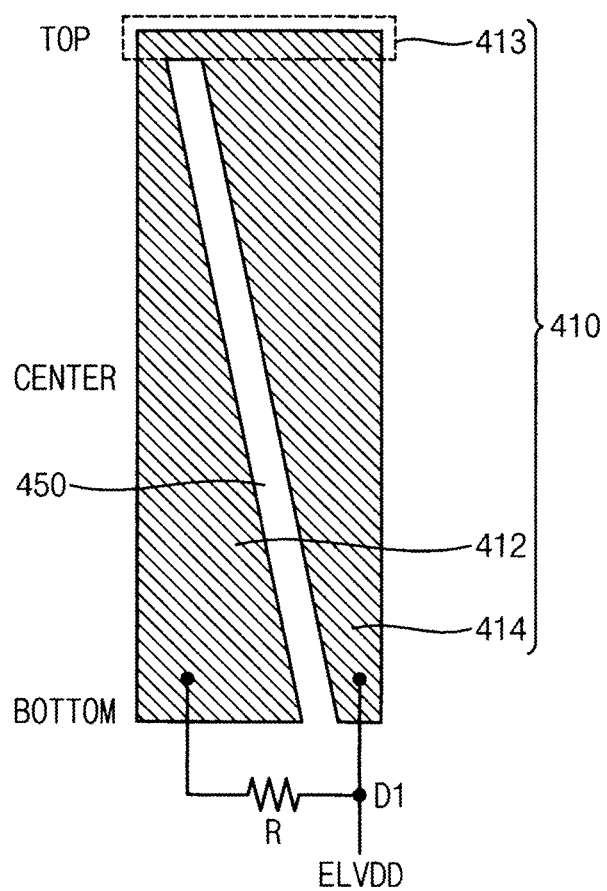
FIG. 18 is a diagram illustrating a resistance compensating a voltage drop generated in a power supply voltage line of FIG. 16.
Figure 19:
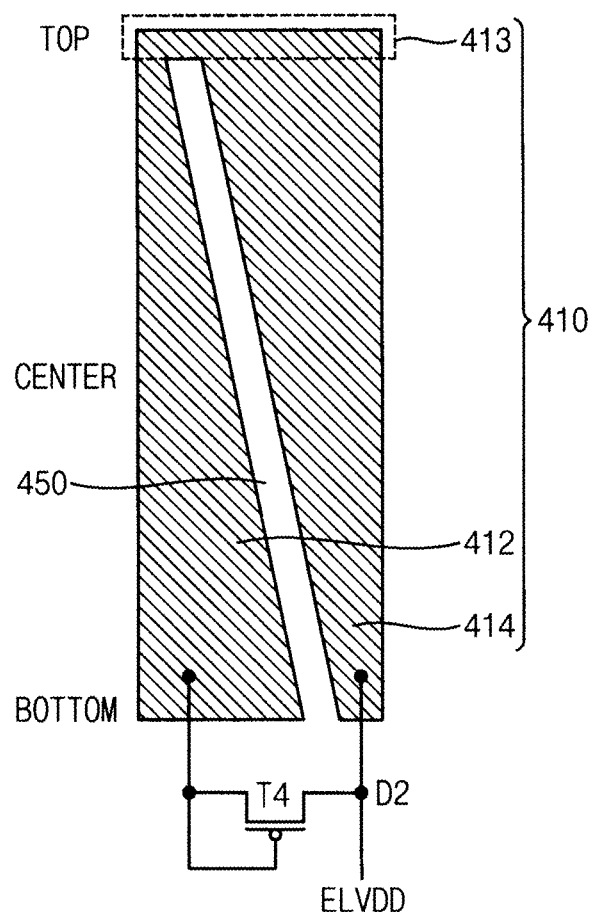
FIG. 19 is a diagram illustrating a diode-coupled transistor compensating a voltage drop generated in a power supply voltage line of FIG. 16.

FIG. 16 is a plan view illustrating a power supply voltage line in accordance with some example embodiments, and FIG. 17 is a diagram illustrating a transistor compensating a voltage drop generated in a power supply voltage line of FIG. 16. FIG. 18 is a diagram illustrating a resistance compensating a voltage drop generated in a power supply voltage line of FIG. 16, and FIG. 19 is a diagram illustrating a diode-coupled transistor compensating a voltage drop generated in a power supply voltage line of FIG. 16.

A first power supply voltage line 410 illustrated in FIGS. 16 through 19 may have a configuration substantially the same as or similar to that of the first power supply voltage line 170 described with reference to FIGS. 7 through 9 except an use of one high power supply voltage. In FIGS. 16 through 19, detailed descriptions for elements, which are substantially the same as or similar to the elements described with reference to FIGS. 7 through 9, will be omitted.

Referring to FIGS. 3 and 16 through 19, a first power supply voltage line 410 (for example, a high power supply voltage line) may include a first extension 412, a second extension 413, a third extension 414, and a separation region

450. A display panel 110 may separate a first side region BOTTOM, a center region CENTER, and a second side region TOP. A first power supply may be connected to the first power supply voltage line 410 and a second power supply voltage line.

The first extension 412 may be disposed along a first direction (for example, a direction from the first side region BOTTOM to the second side region TOP). The second extension 413 may be disposed along a second direction perpendicular to the first direction. The third extension 414 may be disposed along a third direction opposite to the first direction. The first direction may be parallel to the third direction. The first extension 412, the second extension 413, and the third extension 414 may be disposed at the same level, and formed as one body.

The first extension 412 may include a first portion located adjacent to the first side region BOTTOM of a display panel 110 and a second portion located adjacent to the second side region TOP of the display panel 110. A width of the first extension 412 may be gradually decreased in the first direction. The first extension 412 may be connected to pixels PX. Since the first extension 412 includes the gradually decreasing width, each of the pixels PX connected to the first extension 412 may be connected to each of different widths of the first extension 412.

The third extension 414 may include a third portion located adjacent to the first side region BOTTOM and a fourth portion located adjacent to the second side region TOP. A width of the third extension 414 may be gradually increased in the first direction. The width of the third extension 414 may be gradually decreased in the third direction. When a second power supply voltage ELVDD(H) may be transferred via the third extension 414 in the first direction (for example, a direction from the first side region BOTTOM to the second side region TOP), the third extension 414 may not be connected to the pixels PX.

The second extension 413 may include a fifth portion connected to the second portion of the first extension 412 and a sixth portion connected to the fourth portion of the third extension 414. The second extension 413 may be extended along the second direction. The second extension 413 may be located adjacent to the second side region TOP.

The separation region 450 may include a first end located adjacent to the first side region BOTTOM and a second end located adjacent to the second side region TOP. The first end of the separation region 450 may be opened in the third direction, and the second end of the separation region 450 may be closed in the first direction by the second extension 413. The separation region 450 may be interposed between the first extension 412 and the third extension 414 such that the first extension 412 and the third extension 414 are separated. In example embodiments, the separation region 450 may include a line-shaped opening or a bar-shaped opening. In some example embodiments, the separation region 450 may include a curve-shaped opening. In a forming process of the separation region 450, as an OLED display device becomes larger, a size of the display panel 110 may be increased. In addition, widths of the first power supply voltage line 410 may be increased. Thus, the separation region 450 may be formed in the first power supply voltage line 410. As illustrated in FIG. 16, the first extension 412, the second extension 413, the third extension 414, and the first separation region 450 may be formed as one electrode.

The power supply may generate a first power supply voltage ELVDD and a second power supply voltage ELVSS. The power supplies may be located adjacent to the first side region BOTTOM. The power supply may apply the first and second power supply voltages ELVDD and ELVSS to the third portion of the third extension 414 and the first end of the second power supply voltage line, respectively. In example embodiments, the first power supply voltage ELVDD may be applied to the third extension 414.

The first power supply voltage ELVDD applied to the third extension 414 may be provided to the pixels PX via the third extension 414, the second extension 413, the second portion of the first extension 412, and the first portion of the first extension 412 in the third direction.

When the first power supply voltage ELVDD applied to the third extension 414 is provided to the pixels PX in the third direction, an IR drop may occur. To reduce the IR drop, the OLED display device may further include a transistor, a resistance, diode-coupled transistor, and the like.

Referring again to FIGS. 16 and 17, a pixel PX (refer to FIG. 2) included in the OLED display device may further include a third transistor T3. For example, when the third transistor T3 is added in the pixel PX, the third extension 414 of the first power supply voltage line 410, the second extension 413, and the third extension 414 may be included in the pixel PX. In example embodiments, a first contact point C1 located adjacent to the first side region BOTTOM of the first extension 412 and a second contact point C2 located adjacent to the first side region BOTTOM of the third extension 414 may be electrically connected to the pixel PX. In particular, the third transistor T3 may include a control electrode connected to a second node N2 to which the first power supply voltage ELVDD passing a first resistance R1 is applied, an input electrode connected to the second contact point C2 to which the first power supply voltage ELVDD is applied, and an output electrode connected between an output electrode of a driving transistor T1 and an anode electrode of an organic light emitting diode OLED. The first resistance R1 is a line resistance from the second contact point C2 of the third extension 414 to the first contact point C1 of the first extension 412 through the fourth portion of the third extension 414 and the second portion of the first extension 412. In this case, a voltage level of the second node N2 may be less than that of the second contact point C2 according to an IR drop. Thus, an additional current (for example, compensation current) may be applied to the output electrode of the third transistor T3. The additional current may be based on a difference of a voltage level applied to the control electrode of the third transistor T3 and a voltage level applied to the input electrode of the third transistor T3. Similarly, a third contact point C3 located adjacent to the second side region TOP of the first extension 412 and a fourth contact point C4 located adjacent to the second side region TOP of the third extension 414 may be electrically connected to the pixel PX. In particular, the third transistor T3 may include a control electrode connected to a second node N2 to which the first power supply voltage ELVDD passing a (N)th resistance RN is applied, an input electrode connected to the fourth contact point C4 to which the first power supply voltage ELVDD is applied, and an output electrode connected between the output electrode of the driving transistor T1 and the anode electrode of the organic light emitting diode OLED. The (N)th resistance RN is a line resistance from the fourth contact point C4 of the third extension 414 to the third contact point C3 of the first extension 412. In this case, a voltage level of the second node N2 may be less than that of the fourth contact point C4 according to an IR drop. Thus, an additional current (for example, compensation current) may be applied to the output electrode of the third transistor T3. The additional current may be based on a difference of a voltage level applied to the control electrode of the third transistor T3 and a voltage level applied to the input electrode of the third transistor T3. However, a resistance level of the first resistance R1 between the first contact point C1 and the second contact point C2 may be higher than that of the (N)th resistance RN between the third contact point C3 and the fourth contact point C4. Accordingly, the additional current may be differentially provided to the output electrode of the third transistor T3.

Referring to FIG. 18, in example embodiments, a resistance R connected to the first portion of the first extension 412 and the third portion of the third extension 414 may be added. In this case, the first power supply voltage ELVDD applied to the third portion of the third extension 414 may be transferred from the third extension 414 to the first portion of the first extension 412 through the second portion of the first extension 412. When an IR drop occurs in the first power supply voltage line 410, the first power supply voltage ELVDD may be provided via the resistance R from the a first branch point D1 to the first portion of the first extension 412. Accordingly, the additional current may be provided to the first portion of the first extension 412 via the resistance R.

Referring to FIG. 19, in example embodiments, a diode-coupled T4 transistor connected to the first portion of the first extension 412 and the third portion of the third extension 414 may be added. In this case, the first power supply voltage ELVDD applied to the third portion of the third extension 414 may be transferred from the third extension 414 to the first portion of the first extension 412 through the second portion of the first extension 412. The diode-coupled T4 may include an input electrode connected to a second branch point to which the first power supply voltage ELVDD is applied, a control electrode connected to the third portion of the third extension 414 to which the first power supply voltage ELVDD passing the third extension 414 and the first extension 412 is applied, and an output electrode. When an IR drop occurs in the first power supply voltage line 410, the first power supply voltage ELVDD may be provided via the diode-coupled T4 from a second branch point D2 to the first portion of the first extension 412. Accordingly, the additional current may be provided to the first portion of the first extension 412 via the diode-coupled T4

As described above, as the OLED display device includes the first power supply voltage line 410 having the first separation region 450, an IR drop generated in the first extension 412 of the first power supply voltage line 410 may be reduced. In addition, as the OLED display device includes the third transistor T3, the resistance R, and diode-coupled T4, an IR drop generated in the first extension 412 of the first power supply voltage line 410 may be reduced. An LRU of the display panel 110 may be improved.

As illustrated in FIGS. 16, 18, and 19, the first power supply voltage ELVDD is applied to the third extension 414, but the first power supply voltage ELVDD may be applied to the first extension 412 in other embodiments.

Figure 20:
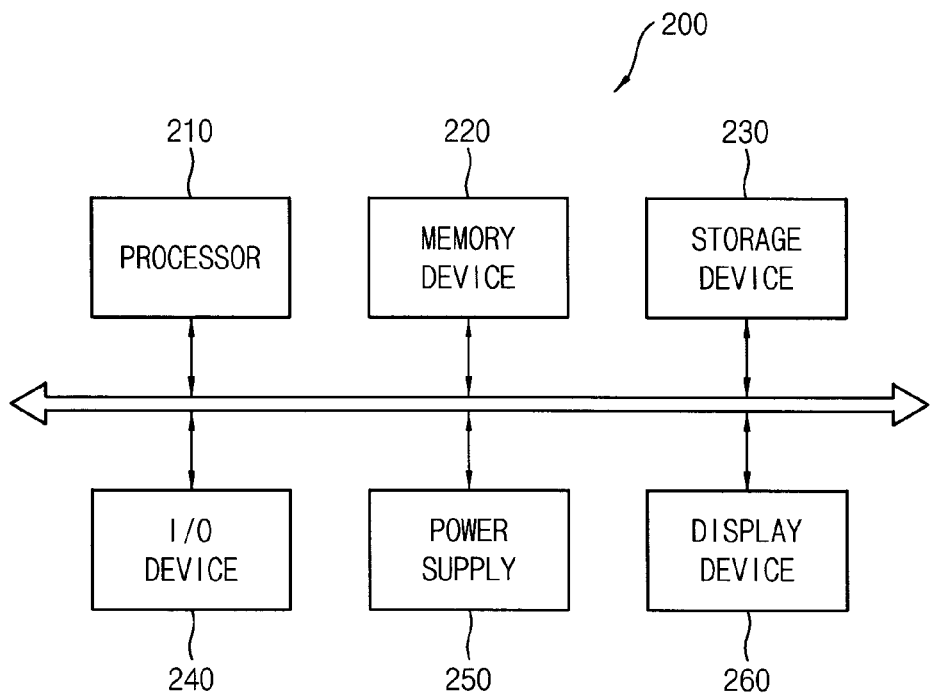
FIG. 20 is a block diagram illustrating an electronic device having a display device in accordance with example embodiments.
Figure 21:
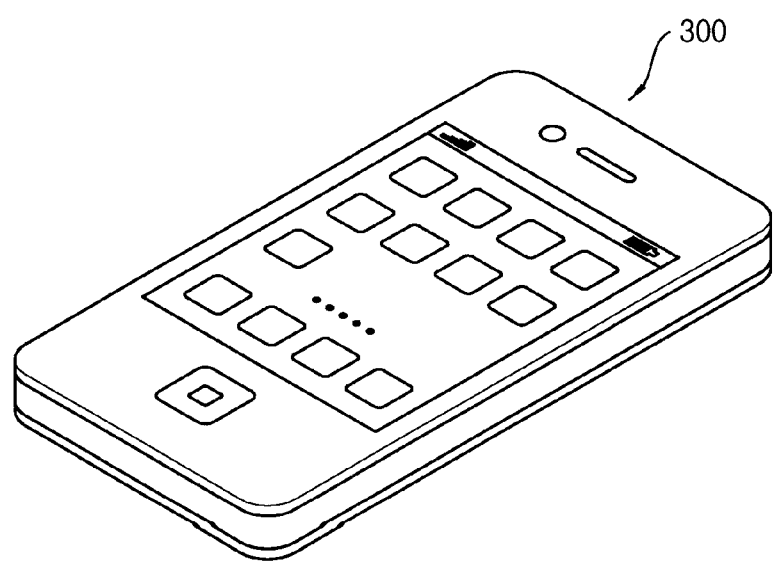
FIG. 21 is a diagram illustrating an example in which the electronic device of FIG. 19 is implemented as a smart-phone.

FIG. 20 is a block diagram illustrating an electronic device having a display device in accordance with example embodiments, and FIG. 21 is a diagram illustrating an example in which the electronic device of FIG. 19 is implemented as a smart-phone.

Referring to FIGS. 20 and 21, an electronic device 200 may include a processor 210, a memory device 220, a storage device 230, an input/output (I/O) device 240, a power supply 250, and a display device 260, such as for example an OLED display device. The electronic device 200 may further include one or more ports for communicating a video card, a sound card, a memory card, a universal serial bus (USB) device, other electronic devices, and the like. Although it is illustrated in FIG. 21 that the electronic device 200 is implemented as a smart-phone 300, a kind of the electronic device 200 is not limited thereto in other embodiments.

The processor 210 may perform various computing functions. The processor 210 may be a micro processor, a central processing unit (CPU), or the like. The processor 210 may be coupled to other components via an address bus, a control bus, a data bus, or the like. Further, the processor 210 may be coupled to an extended bus such as a peripheral component interconnection (PCI) bus.

The memory device 220 may store data for operations of the electronic device 200. For example, the memory device 220 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, or the like.

The storage device 230 may be a solid state drive (SSD) device, a hard disk drive (HDD) device, a CD-ROM device, or the like. The I/O device 240 may be an input device such as a keyboard, a keypad, a touchpad, a touch-screen, a mouse, or the like, and an output device such as a printer, a speaker, or the like. The power supply 250 may provide a power for operations of the electronic device 200. The display device 260 may communicate with other components via the buses or other communication links.

The display device 260 may correspond to the organic light emitting diode (OLED) display device 100 of FIG. 1 that may include the pixel PX of FIG. 2 and a power supply 160 having the first power supply voltage line 170 of FIG. 8. Therefore, as the organic light emitting diode display device 260 includes the first power supply voltage line 170, an IR drop generated in the organic light emitting diode display device 260 may be reduced.

The example embodiments may be applied to any electronic device or system 200 having the display device 260. For example, embodiments may be applied to the electronic system 200, such as a digital or 3D television, a computer monitor, a home appliance, a laptop, a digital camera, a cellular phone, a smart phone, a personal digital assistant (PDA), a portable multimedia player (PMP), a MP3 player, a portable game consol, a navigation system, a video phone, or the like.

Embodiments may be applied to any arbitrary display device having a power supply. For example, the present may be applied to the mobile phone, the smart phone, the laptop computer, the tablet computer, the personal digital assistant (PDA), the portable multimedia player (PMP), the digital camera, the music player (e.g., a MP3 player), the portable game console, the navigation, or the like.

The foregoing is illustrative of example embodiments and is not to be construed as limiting thereof. Although certain embodiments have been described, those skilled in the art will readily appreciate that many modifications are possible without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting diode display device, comprising:
a display panel including a plurality of pixels, the display panel having a first side portion, a second side portion opposite to the first side portion, and a center portion located between the first side portion and the second side portion; and
a power supply configured to apply a first power supply voltage and a second power supply voltage to a first power supply voltage line, the power supply being located adjacent to the first side portion of the display panel,
wherein the first power supply voltage line includes:
a first extension disposed along a first direction from the first side portion to the second side portion, the first extension having a width that gradually decreases along the first direction;
a second extension disposed along a second direction that is perpendicular to the first direction; and
a third extension disposed along a third direction that is opposite to the first direction, the third extension having a width that gradually decreases along the third direction.

2. The display device of claim 1, wherein the first through third extensions of the first power supply voltage line are disposed at the same level and formed as one body.

3. The display device of claim 2, wherein the first extension of the first power supply voltage line includes a first portion located adjacent to the first side portion of the display panel and a second portion located adjacent to the second side portion of the display panel, the first power supply voltage being applied to the first portion of the first extension, the first extension of the first power supply voltage line being connected to the pixels,
wherein the third extension of the first power supply voltage line includes a third portion located adjacent to the first side portion of the display panel and a fourth portion located adjacent to the second side portion of the display panel, the second power supply voltage being applied to the third portion of the third extension, and
wherein the second extension of the first power supply voltage line includes a fifth portion connected to the second portion of the first extension and a sixth portion connected to the fourth portion of the third extension, the second extension being located adjacent to the second side portion of the display device.

4. The display device of claim 3, further comprising:
a separation region interposed between the first extension and the third extension such that the first extension and the third extension are separated from one another,
wherein the separation region includes:
a first end located adjacent to the first side portion of the display panel, the first end of the separation region being opened in the third direction; and
a second end located adjacent to the second side portion of the display panel, the second end of the separation region being closed in the first direction by the second extension.

5. The display device of claim 4, wherein the separation region has at least one of a line-shaped opening or a bar-shaped opening.

6. The display device of claim 4, wherein the separation region has a curve-shaped opening.

7. The display device of claim 6, wherein the curve in the curve-shaped opening is formed such that a slope from the first side portion to the center portion is less than a slope from the center portion to the second side portion.

8. The display device of claim 3, wherein the first power supply voltage is applied to the pixels via the first extension in the first direction from the first side portion to the second side portion, and wherein the second power supply voltage is applied to the pixels via the first extension in the third direction from the second side portion to the first side portion after the second power supply voltage is transferred via the third extension and the second extension in the first direction from the first side portion to the second side portion.

9. The display device of claim 1, wherein a voltage level of the first power supply voltage is lower than a voltage level of the second power supply voltage.

10. The display device of claim 1, further comprising:
a second power supply voltage line extended along the first direction, the second power supply voltage line being connected to the pixels,
wherein the second power supply voltage line includes:
a first end located adjacent to the first side region of the display panel, the first end of the second power supply voltage line being connected to the power supply; and
a second end located adjacent to the second side portion, and
wherein the power supply is configured to apply a third power supply voltage to the first end of the second power supply voltage line.

11. An organic light emitting diode display device, comprising:
a display panel including a plurality of pixels, the display panel having a first side portion, a second side portion opposite to the first side portion, and a center portion located between the first side portion and the second side portion; and
a power supply configured to apply a first power supply voltage to a first power supply voltage line, the power supply located adjacent to the first side portion of the display panel,
wherein the first power supply voltage line includes:
a first extension disposed along a first direction from the first side portion to the second side portion, the first extension having a width that gradually decreases along the first direction;
a second extension disposed along a second direction that is perpendicular to the first direction; and
a third extension disposed along a third direction that is opposite to the first direction, the third extension having a width that gradually decreases along the third direction.

12. The display device of claim 11, wherein the first through third extensions of the first power supply voltage line are disposed at the same level and formed as one body.

13. The display device of claim 12, wherein the first extension of the first power supply voltage line includes a first portion located adjacent to the first side portion of the display panel and a second portion located adjacent to the second side portion of the display panel, the first extension of the first power supply voltage line being connected to the pixels,
wherein the third extension of the first power supply voltage line includes a third portion located adjacent to the first side portion of the display panel and a fourth portion located adjacent to the second side portion of the display panel, the first power supply voltage being applied to the third portion of the third extension, and wherein the second extension of the first power supply voltage line includes a fifth portion connected to the second portion of the first extension and a sixth portion connected to the fourth portion of the third extension, the second extension being located adjacent to the second side portion of the display device.

14. The display device of claim 13, further comprising:
a separation region interposed between the first extension and the third extension such that the first extension and the third extension are separated from one another,
wherein the separation region includes:
   a first end located adjacent to the first side portion of the display panel, the first end of the separation region being opened in the third direction; and
   a second end located adjacent to the second side portion of the display panel, the second end of the separation region being closed in the first direction by the second extension.

15. The display device of claim 14, wherein the separation region has at least one of a line-shaped opening, a bar-shaped opening, or a curve-shaped opening.

16. The display device of claim 13, wherein the first power supply voltage is applied to the pixels via the first extension in the third direction from the second side portion to the first side portion after the first power supply voltage is transferred via the third extension and the second extension in the first direction from the first side portion to the second side portion.

17. The display device of claim 13, further comprising:
a transistor disposed between the power supply and the first power supply voltage line,
wherein the transistor directly applies a compensation current to the pixels when a voltage drop occurs at the first power supply voltage line.

18. The display device of claim 13, further comprising:
a resistance disposed between the power supply and the first power supply voltage line,
wherein a compensation current is applied to the first portion of the first extension via the resistance when a voltage drop occurs at the first power supply voltage line.

19. The display device of claim 13, further comprising:
a diode-coupled transistor disposed between the power supply and the first power supply voltage line,
wherein the diode-coupled transistor applies a compensation current to the first portion of the first extension.

20. The display device of claim 11, further comprising:
a second power supply voltage line extended along the first direction, the second power supply voltage line being connected to the pixels,
wherein the second power supply voltage line includes:
   a first end located adjacent to the first side portion of the display panel, the first end of the second power supply voltage line being connected to the power supply; and
   a second end located adjacent to the second side portion, and
wherein the power supply applies a second power supply voltage to the first end of the second power supply voltage line.

* * * * *